US012327692B2

(12) United States Patent
Jeong et al.

(10) Patent No.: US 12,327,692 B2
(45) Date of Patent: Jun. 10, 2025

(54) SEMICONDUCTOR DEVICE HAVING A HIGH BREAKDOWN VOLTAGE CAPACITOR AND METHOD FOR FORMING THE SAME

(71) Applicant: SK keyfoundry Inc., Cheongju-si (KR)

(72) Inventors: Jong Yeul Jeong, Cheongju-si (KR);
Jeong Ho Sheen, Cheongju-si (KR);
Guk Hyeon Yu, Okcheon-gun (KR);
Kang Sup Shin, Cheongju-si (KR);
Kyung Ho Lee, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 763 days.

(21) Appl. No.: 17/508,132

(22) Filed: Oct. 22, 2021

(65) Prior Publication Data

US 2022/0277900 A1 Sep. 1, 2022

(30) Foreign Application Priority Data

Feb. 26, 2021 (KR) .......................... 10-2021-0026681

(51) Int. Cl.
*H01G 4/33* (2006.01)
*H01G 4/12* (2006.01)

(52) U.S. Cl.
CPC ................. *H01G 4/33* (2013.01); *H01G 4/12* (2013.01)

(58) Field of Classification Search
CPC ................................... H01G 4/33; H01G 4/12
USPC ..................... 361/301.4, 306.3, 321.1, 321.3
See application file for complete search history.

(56) References Cited

U.S. PATENT DOCUMENTS

| | | | |
|---|---|---|---|
| 6,597,032 B1 * | 7/2003 | Lee | H01L 28/55 257/532 |
| 7,402,889 B2 * | 7/2008 | Park | H01L 28/91 257/532 |
| 9,299,697 B2 | 3/2016 | West et al. | |
| 9,583,558 B2 | 2/2017 | West et al. | |
| 9,768,245 B2 | 9/2017 | West et al. | |
| 10,147,784 B2 | 12/2018 | West et al. | |

(Continued)

FOREIGN PATENT DOCUMENTS

JP 2000-228497 A 8/2000

OTHER PUBLICATIONS

Korean Office Action issued on Jun. 1, 2022, in counterpart Korean Patent Application No. 10-2021-0026681 (6 pages in Korean).

*Primary Examiner* — Arun Ramaswamy
(74) *Attorney, Agent, or Firm* — NSIP Law

(57) ABSTRACT

A semiconductor device includes a substrate, the substrate includes a capacitor region and a metal wiring region. The capacitor region includes a lower electrode formed on the substrate, an interlayer insulating layer formed on the lower electrode, a dielectric layer pattern formed on the interlayer insulating layer, and an upper electrode formed on the dielectric layer pattern. The metal wiring region includes a lower metal wiring formed parallel to the lower electrode, the interlayer insulating layer formed on the lower metal wiring, an upper insulating layer formed on the interlayer insulating layer and having a thickness smaller than a thickness of the interlayer insulating layer, and an upper metal wiring formed on the upper insulating layer, and formed in parallel with the upper electrode. The upper insulating layer and the dielectric layer pattern are formed of different materials.

24 Claims, 17 Drawing Sheets

(56) References Cited

U.S. PATENT DOCUMENTS

2007/0201182 A1\* 8/2007 Nakayama ............... H01G 4/33
361/311
2019/0067308 A1\* 2/2019 Yun ........................ H10B 20/60

\* cited by examiner

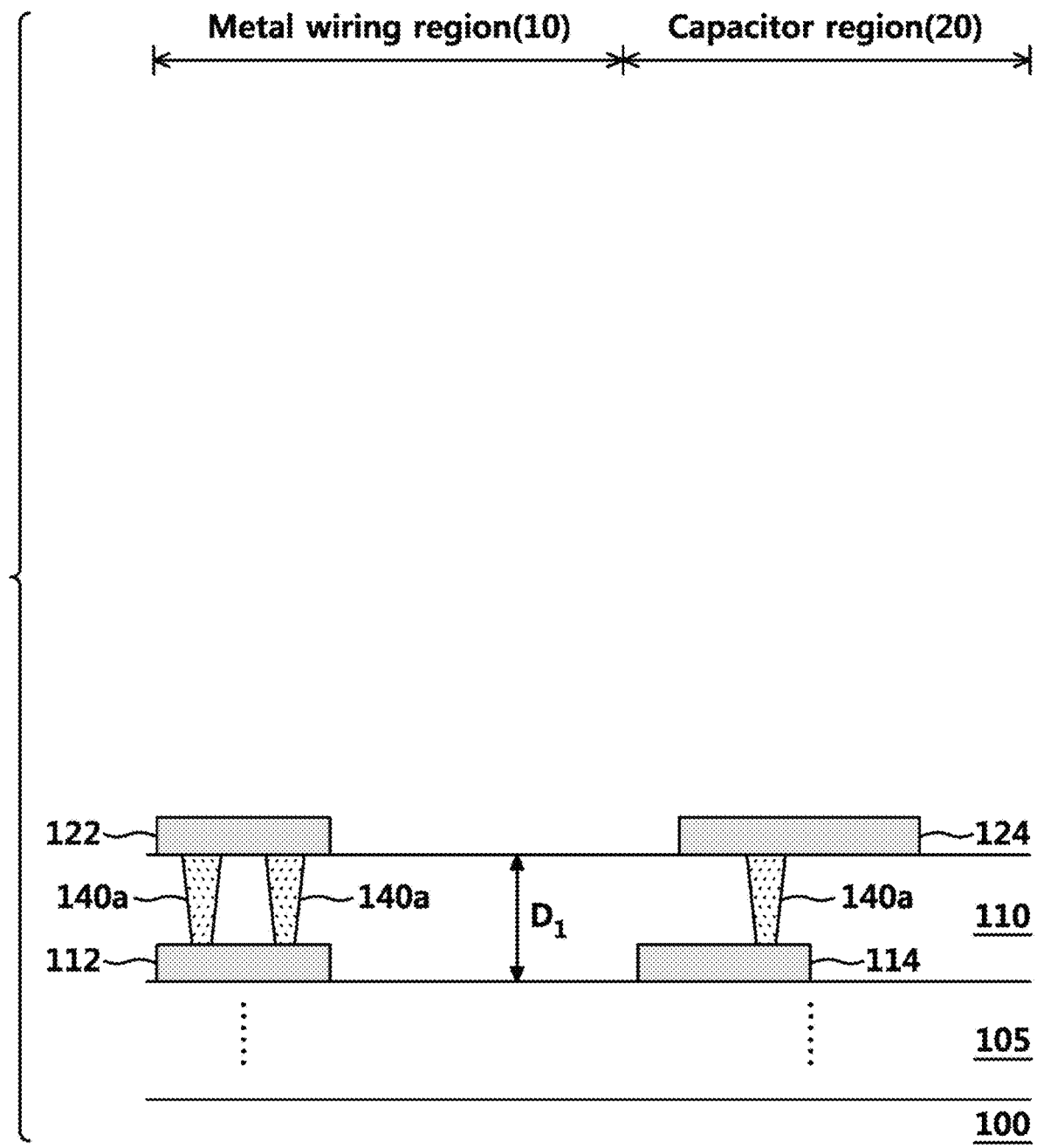

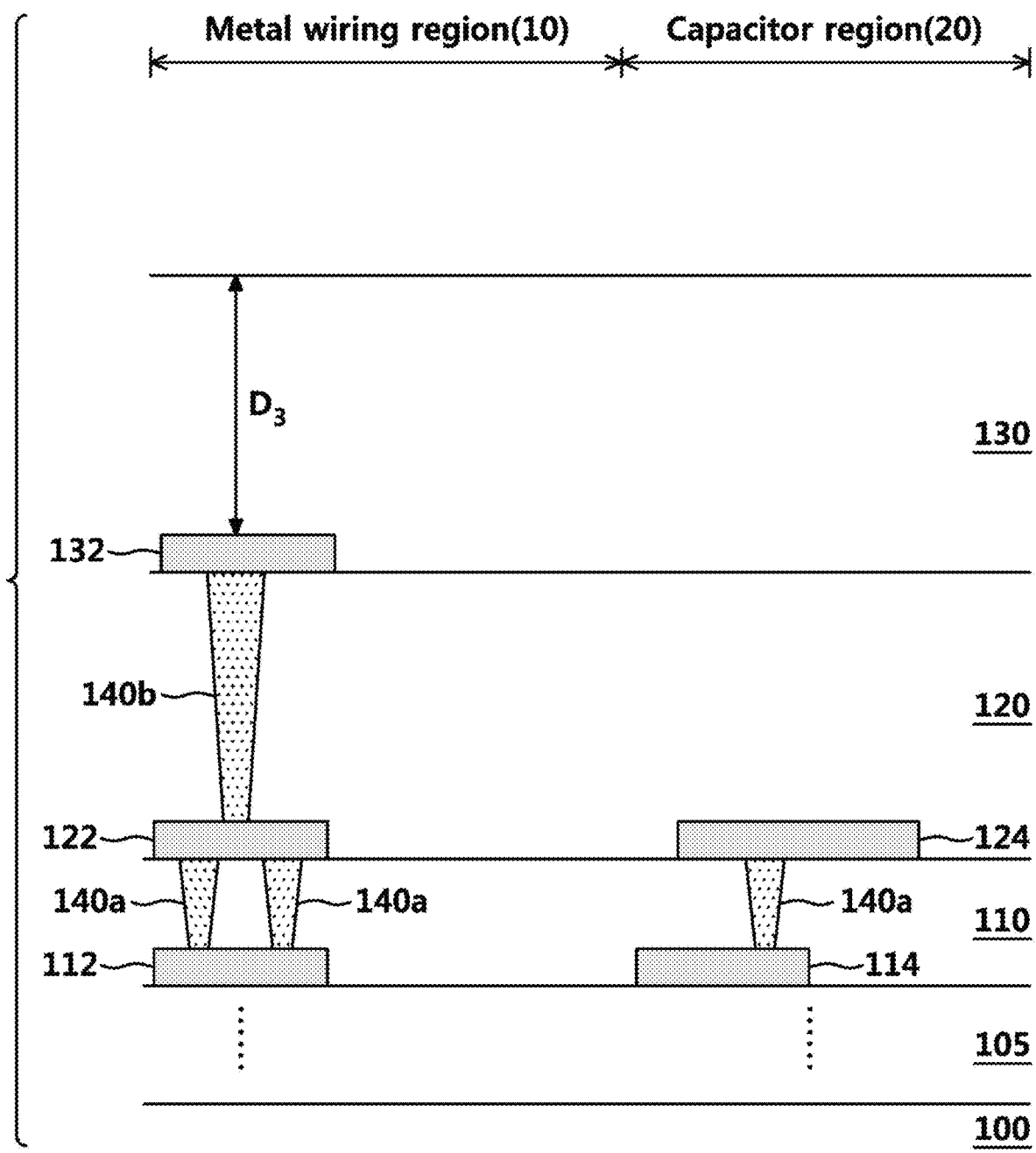

SEMICONDUCTOR DEVICE HAVING A HIGH BREAKDOWN VOLTAGE CAPACITOR AND METHOD FOR FORMING THE SAME

CROSS-REFERENCE TO RELATED APPLICATIONS

This application claims the benefit under 35 U.S.C. 119(a) of Korean Patent Application No. 10-2021-0026681 filed on Feb. 26, 2021 with the Korean Intellectual Property Office, the entire disclosure of which is incorporated herein by reference for all purposes.

BACKGROUND

1. Field

The present disclosure relates to a semiconductor device, including a high breakdown voltage capacitor having a high breakdown voltage characteristic and a method of manufacturing the same.

2. Description of Related Art

A thick silicon oxide layer ($SiO_2$) is generally used to form a high breakdown voltage capacitor. Such a high breakdown voltage capacitor is widely used in digital isolator devices. However, because the band gap energy of the silicon oxide layer is relatively high, it may be difficult to meet a super high breakdown voltage characteristic of the digital isolator.

Therefore, the alternative art proposed forming a super high breakdown voltage capacitor structure using a dielectric layer having a band gap energy lower than that of a silicon oxide layer. However, a dielectric layer having a low band gap may be unnecessarily formed not only in the capacitor region but also in peripheral devices. Accordingly, an additional process may occur when manufacturing a peripheral device, which may increase the manufacturing cost of a semiconductor device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a substrate, the substrate includes a capacitor region and a metal wiring region. The capacitor region includes a lower electrode formed on the substrate, an interlayer insulating layer formed on the lower electrode, a dielectric layer pattern formed on the interlayer insulating layer, and an upper electrode formed on the dielectric layer pattern. The metal wiring region includes a lower metal wiring formed parallel to the lower electrode, the interlayer insulating layer formed on the lower metal wiring, an upper insulating layer formed on the interlayer insulating layer and having a thickness smaller than a thickness of the interlayer insulating layer, and an upper metal wiring formed on the upper insulating layer, and formed in parallel with the upper electrode. The upper insulating layer and the dielectric layer pattern are formed of different materials.

The upper insulating layer and the dielectric layer pattern may be in contact with each other, and a thickness of the dielectric layer pattern may be formed to be thinner than the thickness of the upper insulating layer.

The dielectric layer pattern may include an upper dielectric layer and a lower dielectric layer, and a thickness of the upper dielectric layer may be formed to be different from a thickness of the lower dielectric layer.

The dielectric layer pattern may be formed of a dielectric material having a band gap lower than a band gap of the upper insulating layer.

The dielectric layer pattern may include any one of silicon rich oxide, SiON, or SiN.

An area of the dielectric layer pattern in a top view may be formed to be larger than an area of the upper electrode.

The dielectric layer pattern may be formed of first and second dielectric layer patterns that may be formed apart from each other.

The interlayer insulating layer, formed between the first and second dielectric layer patterns, may be in direct contact with the upper electrode.

A bottom surface of the upper insulating layer may be formed to be lower than a bottom surface of the dielectric layer pattern.

In another general aspect, a method for manufacturing a semiconductor device includes forming a lower electrode on a semiconductor substrate, forming an interlayer insulating layer on the lower electrode, forming a dielectric layer pattern on the interlayer insulating layer;
forming an upper insulating layer on the interlayer insulating layer using a material different from a material of the dielectric layer pattern, and forming an upper metal wiring and an upper electrode on the upper insulating layer and the dielectric layer pattern, respectively.

The forming of the upper insulating layer may include depositing a thick insulating layer over the dielectric layer pattern and the interlayer insulating layer, removing the thick insulating layer formed on the dielectric layer pattern, and forming the upper insulating layer having a thickness thinner than a thickness of the interlayer insulating layer.

The removing of the thick insulating layer formed on the dielectric layer pattern may be by a chemical mechanical polishing (CMP) process.

The dielectric layer pattern may be formed of a plurality of layers.

A bottom surface of the upper insulating layer may be formed to be deeper than a bottom surface of the dielectric layer pattern.

A thickness of the dielectric layer pattern overlapping the upper electrode may be formed to be greater than a thickness of the dielectric layer pattern that does not overlap the upper electrode.

The dielectric layer pattern may include an upper dielectric layer and a lower dielectric layer, and a thickness of the upper dielectric layer may be greater than a thickness of the lower dielectric layer.

The dielectric layer pattern may be formed of a dielectric material having a band gap lower than the upper insulating layer. The dielectric material may be used with PECVD silicon rich oxide or PECVD SiON or PECVD SiN.

In another general aspect, a semiconductor device, includes a lower electrode on a semiconductor substrate, an interlayer insulating layer formed on the lower electrode, a dielectric layer pattern formed on the interlayer insulating layer, an upper insulating layer formed, on the interlayer insulating layer, of a material different from a material of the dielectric layer pattern, and an upper metal wiring and an upper electrode formed on the upper insulating layer and the dielectric layer pattern, respectively.

The dielectric layer pattern may include a lower dielectric layer and an upper dielectric layer, and a thickness of the lower dielectric layer may be uniform.

A bottom surface of the upper insulating layer may be formed to be deeper than a bottom surface of the dielectric layer pattern.

The dielectric layer pattern may include a region overlapping the upper electrode, a region that does not overlap the upper electrode, and a region in which the pattern thickness of the dielectric layer may be changed. A thickness of the region overlapping the upper electrode may be greater than a thickness of the region not overlapping the upper electrode.

The dielectric layer pattern may include an upper dielectric layer and a lower dielectric layer, and a thickness of the upper dielectric layer may be formed to be greater than a thickness of the lower dielectric layer.

The dielectric layer pattern may be formed of a dielectric material having a band gap lower than a band gap of the upper insulating layer. The upper insulating layer may include a silicon oxide layer, and the dielectric layer pattern may include any one of silicon rich oxide, SiON, or SiN.

A thickness of the dielectric layer pattern and a thickness of the upper insulating layer may be different from each other.

In another general aspect, a semiconductor device includes a substrate. The substrate includes a first region and a second region. The first region includes a lower electrode formed on the substrate, an interlayer insulating layer formed on the lower electrode, a dielectric layer pattern formed on the interlayer insulating layer, and an upper electrode formed on the dielectric layer pattern. The second region includes an upper insulating layer formed on the interlayer insulating layer and having a thickness smaller than a thickness of the interlayer insulating layer, and an upper metal wiring formed on the upper insulating layer, and formed in a same plane with the upper electrode. A lower surface of the upper insulating layer and a lower surface of the dielectric layer pattern are in different planes.

The second region may further include a first lower metal wiring and the lower electrode formed on a same plane, wherein the interlayer insulating layer is further formed on the lower metal wiring, a second lower metal wiring formed at an intermediate position between the first lower metal wiring and the upper insulating layer, and a first via connecting the first lower metal wiring to the second lower metal wiring and a second via connecting the second lower metal wiring to the upper metal wiring The first region may be a capacitor region and the second region may be a metal wiring region.

The upper insulating layer and the dielectric layer pattern may be formed of different materials.

Each of the upper insulating layer and the dielectric layer pattern has a contour that includes an inclined portion.

Other features and aspects will be apparent from the following detailed description, the drawings, and the claims.

BRIEF DESCRIPTION OF THE DRAWINGS

FIGS. 6A-6L are process diagrams illustrating a manufacturing process of a semiconductor device, including a high breakdown voltage capacitor according to one or more examples of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
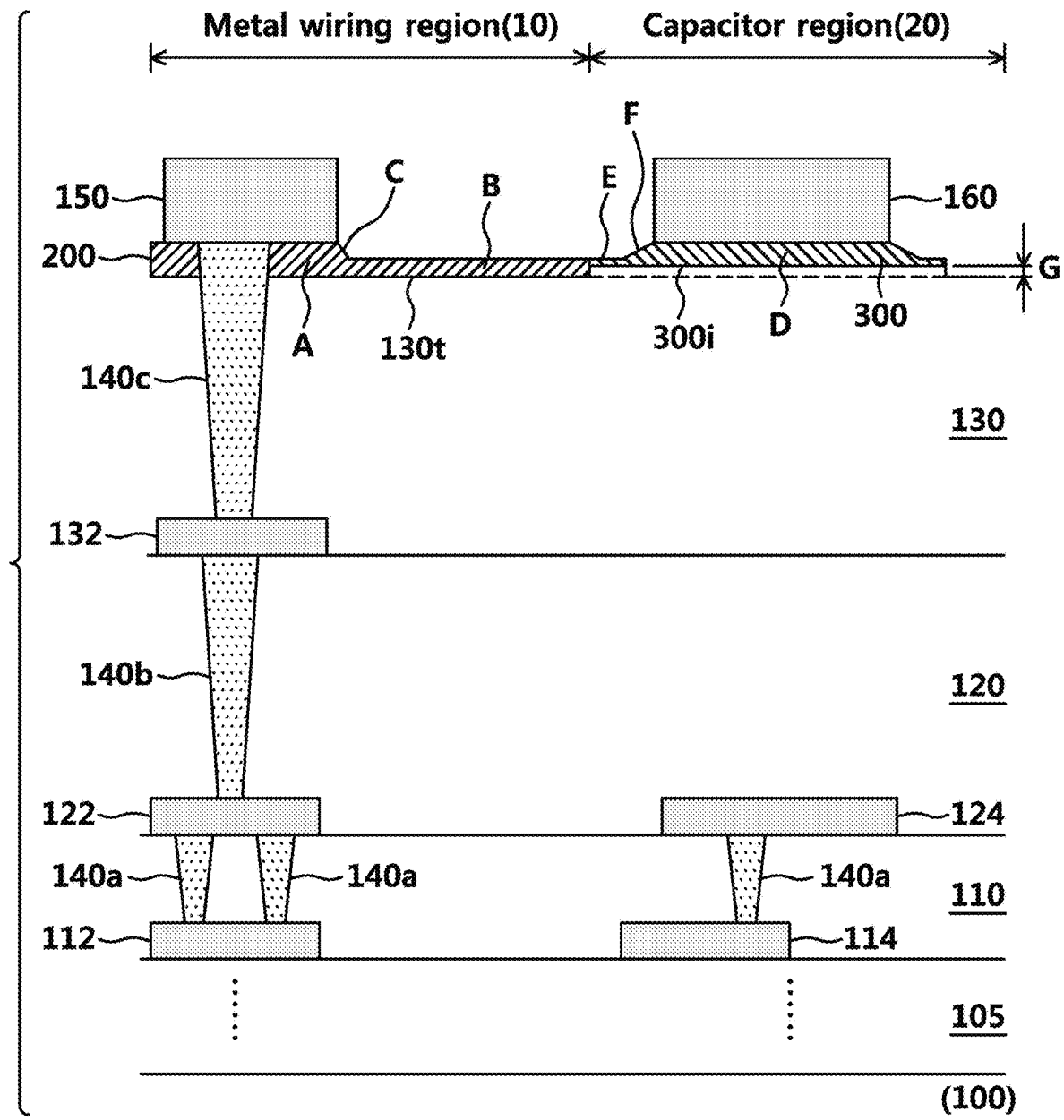
FIG. 1 is a cross-sectional view of a semiconductor device, including a high breakdown voltage capacitor, according to one or more examples of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure provides a semiconductor device in which a dielectric layer having a low band gap is formed only in a high breakdown voltage capacitor region and a method of manufacturing the same.

FIG. 1 is a cross-sectional view of a semiconductor device, including a high breakdown voltage capacitor, according to one or more examples of the present disclosure. As illustrated in FIG. 1, the semiconductor device includes an interconnection area or a metal wiring region 10 and a capacitor region 20.

The metal wiring region 10 is a region in which metal wirings connected to respective devices are formed for driving devices such as CMOS, LDMOS, EDMOS, and BJT. Therefore, because devices such as CMOS, LDMOS, EDMOS, and BJT operate at a much lower voltage than a high breakdown voltage capacitor, the metal wiring region 10 may be referred to as a low voltage region. Alternatively, the metal wiring region 10 may be viewed as a region in which a pad is formed. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

On the other hand, the high breakdown voltage capacitor region 20 is a region where a voltage of hundreds to tens of thousands of volts (V) is applied. Therefore, the high breakdown voltage capacitor region 20 may be referred to as a high breakdown voltage region or a high breakdown voltage capacitor. The voltage of hundreds to tens of thousands of volts (V) across the capacitor region should not reach the metal wiring region. A digital isolator requires such a high breakdown voltage capacitor region 20. Hereinafter, the high breakdown voltage capacitor region 20 is simply referred to as a capacitor region 20 for convenience of description.

The metal wiring region 10 and the capacitor region 20 commonly include a substrate 100 underneath. The substrate 100 may be a p-type semiconductor substrate, an n-type semiconductor substrate, a silicon on insulator (SOI) substrate, or the like.

The metal wiring region 10 may include a lower insulating layer 105 formed on the substrate 100 and a plurality of inter-metal dielectrics (IMDs) 110, 120, and 130. The lower insulating layer 105 formed between the metal wiring and the substrate may be referred to as a pre-metal dielectric (PMD) layer. The lower insulating layer 105 and the inter-layer insulating layers 110, 120, and 130 may be formed of different materials or the same material. For example, the lower insulating layer 105 may include a $SiN/SiO_2$ layer deposited by a plasma-enhanced chemical vapor deposition (PECVD) process. And it may further include phosphorus silicate glass (PSG) or boron phosphorus silicate glass (BPSG). And it may further include a cap layer such as a tetraethyl orthosilicate (TEOS) layer deposited by the PECVD method.

In addition, the interlayer insulating layers 110, 120, and 130 may be formed as a layer based on a silicon oxide layer deposited by a PECVD method by using tetraethyl orthosilicate (TEOS). Then, the oxide layer is planarized through an etchback or CMP process. Thus, the interlayer insulating layers 110, 120, and 130 are mainly composed of a silicon oxide material. In the present disclosure, three interlayer insulating layers 110, 120, and 130 are exemplified, but there may be more interlayer insulating layers if desired. In addition, to distinguish from the upper insulating layer 200, the three interlayer insulating layers 110, 120, and 130 may be referred to as a plurality of lower interlayer insulating layers. Here, to prevent bowing of the wafer, it may be desirable to form PE-TEOS (Plasma-enhanced tetraethyl-orthosilicate) having low compressive stress on at least one of the interlayer insulating layers 110, 120, and 130.

In the example, the first to the third interlayer insulating layers are illustrated and referred to as the first interlayer insulating layer 110 and second and third interlayer insulating layers 120 and 130. The first to third interlayer insulating layers 110, 120, and 130 may have different thicknesses, and the thickness of the first interlayer insulating layer 110 may be formed to be thinner than the other second and third interlayer insulating layers 120 and 130. In a non-limiting example, the first interlayer insulating layer 110 may be formed to have a thickness of 0.4 to 1.5 µm, and the second interlayer insulating layer 120 and the third interlayer insulating layer 130 may each have a thickness of 3 to 8 µm.

The metal wiring region 10 may include a plurality of lower metal wirings 112, 122, and 132 for each of the interlayer insulating layers 110, 120, and 130 formed for electrical connection with the MOS transistor. Here, the plurality of lower metal wirings 112, 122, and 132 may be formed of an aluminum (Al) or copper (Cu) material. A first metal wiring 112 is formed on the lower insulating layer 105. In addition, the second metal wiring 122 is formed on the first interlayer insulating layer 110, and the third metal wiring 132 is formed on the second interlayer insulating layer 120. In addition, an upper metal wiring 150 is formed on the third interlayer insulating layer 130 and the upper insulating layer 200. The upper metal wiring 150 may be connected to a bond pad (not illustrated).

In addition, to connect the metal wirings 112, 122, 132 and the upper metal wiring 150 to each other, a plurality of vias 140*a*, 140*b*, 140*c* may be formed in the interlayer insulating layers 110, 120, 130. Each of the vias 140*a*, 140*b*, and 140*c* may be filled with a metallic material. In such a way, in the metal wiring region 10, each of the metal wirings 112, 122, and 132 are electrically connected to each other through the plurality of the first via 140*a*, the second via 140*b*, and the third via 140*c*.

The upper insulating layer 200 of the metal wiring region may be formed of a material such as a silicon oxide layer (SiO2), a silicon nitride layer (SiN), or a silicon oxynitride layer (SiON). In an example of the present disclosure, a silicon oxide layer is taken as an example. The upper insulating layer 200 is formed to include at least two regions having different thicknesses. That is, it may be divided into a region A overlapping under the upper metal wiring 150 and regions B and C outside the upper metal wiring 150. Here, the thickness (A) of the upper insulating layer 200 in the region overlapping the upper metal wiring 150 and the thickness (B) of the upper insulating layer 200 in the region not overlapping the upper metal wiring 150 may be formed differently from each other. For example, the thickness of B is formed to be thinner than that of A. In addition, the region C that does not overlap with the upper metal wiring 150 is an inclined region that changes from A's thickness to B's thickness.

In FIG. 1, the capacitor region 20 includes a lower insulating layer 105, a first metal wiring 114, a first interlayer insulating layer 110, a first via 140*a*, a bottom electrode 124, a second interlayer insulating layer 120, a third interlayer insulating layer 130, a dielectric layer pattern 300, and a top electrode 160. The first metal wiring 114 may be formed simultaneously when forming the first metal wiring 112 in the metal wiring region. The lower electrode 124 is formed together when forming the second metal wiring 122 of the metal wiring region 10, and formed under the capacitor region 20 to which a high breakdown voltage is applied. The lower electrode 124 and the first metal wiring 114 may be electrically connected to each other through the first via 140*a*. Alternatively, the lower electrode 124 may be directly connected to the second metal wiring 122. In addition, it may be connected in various ways.

A metal layer corresponding to the third metal wiring 132 of the metal wiring region 10 is not formed in the capacitor region 20. Instead, very thick interlayer insulating layers 120 and 130 are required to secure super high breakdown voltage characteristics. Therefore, the total thickness of the thick interlayer insulating layers 120 and 130 may have a range of 10-50 μm. The capacitor region 20 does not require a via structure connecting the upper electrode 160 and the lower electrode 124 to each other.

In the capacitor region 20, the dielectric layer pattern 300 is formed of a dielectric material having a low band gap energy characteristic and may be formed of one or more layers. In addition, the dielectric layer pattern 300 is formed before forming the upper metal wiring 150 and the upper electrode 160. Therefore, it may be formed in a shape having a specific pattern in a desired region only under the upper electrode 160. In addition, it may be formed in the capacitor region 20 only without being formed in the metal wiring region 10 by the patterning process.

In the capacitor region 20, the dielectric layer pattern 300 improves the isolator's characteristics, and it is deposited with a material having band gap energy lower than that of the upper insulating layer 200 or the second interlayer insulating layer 120 or the third interlayer insulating layer 130. The dielectric material having such a low band gap characteristic may include PECVD silicon rich oxide (PE-SRO) or PECVD SiON (PE-SiON), PECVD SiN (PE-SiN). Here, the dielectric layer pattern 300 may be formed in a shape of a single layer in which only one of PE-SRO, PE-SiON, and PE-SiN is deposited. Alternatively, it may be formed of two bi-layers, PE-SRO/PE-SiN composed of a lower dielectric layer PE-SRO and an upper dielectric layer PE-SiN. Alternatively, it may be formed of two bi-layers, PE-SRO/PE-SiON composed of a lower dielectric layer PE-SRO and an upper dielectric layer PE-SiON. Alternatively, it may be formed of two bi-layers, PE-SiON/PE-SiN composed of a lower dielectric layer PE-SiON and an upper dielectric layer PE-SiN. Here, it is known that a thermally grown amorphous SiO2 layer has a 9.3 eV (electron volt) band gap. The band gap of PE-SiON is ~7.5 eV which is lower than that of the SiO2 layer, and the PE-SiN layer also has a value in the range of 4.7-6. PE-SRO is known to have a lower band gap value than SiO2. The band gap of the PE-SRO layer is made of a material having a band gap higher than that of PE-SiN (4.7-6).

Referring to FIG. 1, the dielectric layer pattern 300 has two regions having different thicknesses. It may be divided into a region D overlapping under the upper electrode 160 and regions E and F that do not overlap with the upper electrode 160. The E region is formed to be thinner than the D region. The region F, an intermediate region, is a region having an inclination angle and is a region changing from the thickness of D to the thickness of E. As illustrated in the figure, the thickness D of the dielectric layer pattern 300 overlapping the upper electrode 160 is formed to be greater than the thickness E of the dielectric layer pattern 300 in a region outside the upper electrode 160. Therefore, it is formed to be inclined (region F) so that the thickness decreases from the side to the outside of the top electrode 160. The dielectric layer pattern 300 formed in such a way provides a function of effectively mitigating an electric field applied to the lower portion of the upper electrode 160.

As illustrated in FIG. 1, the lower surface 130*t* of the upper insulating layer 200 is formed to be lower than the lower surface 300*i* of the dielectric layer pattern 300. Therefore, there is a step (G) between the two lower surfaces due to the etching process forming the dielectric layer pattern. The etching process with reference to the manufacturing process is to be described later.

Figure 2:
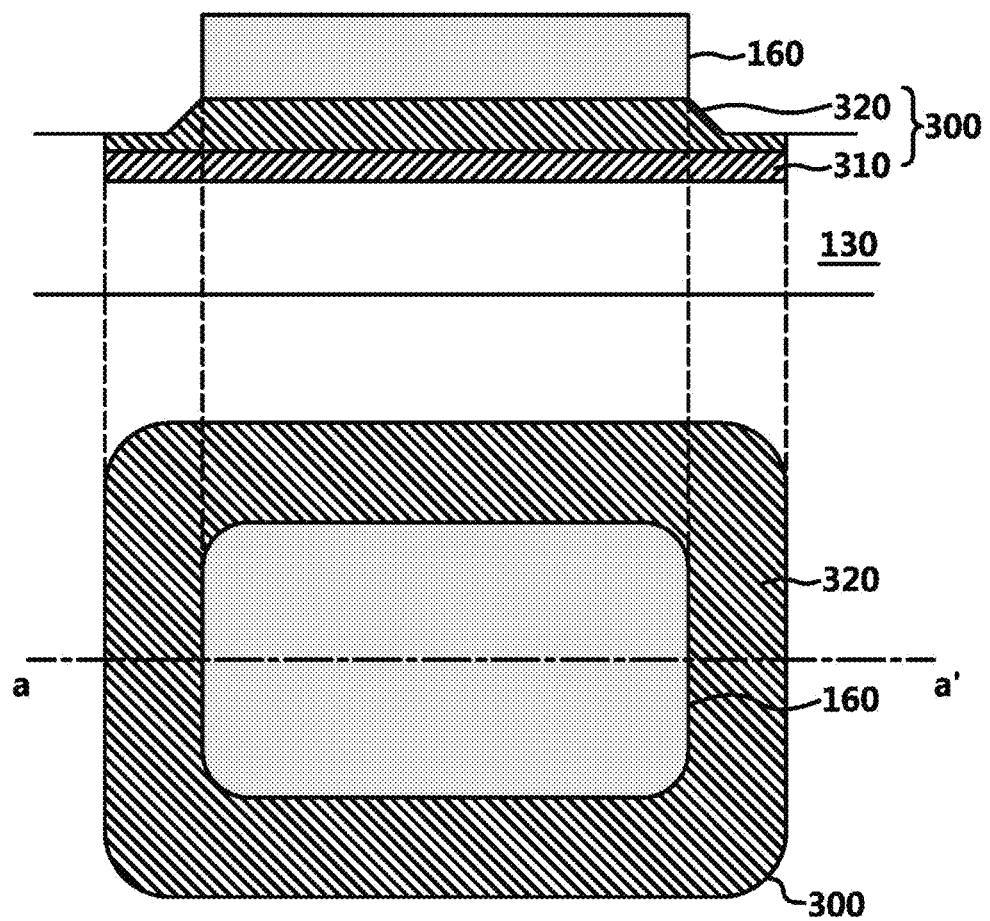
FIG. 2 illustrates a cross-section and a plan view of a high breakdown voltage capacitor according to one or more examples of the present disclosure.

FIG. 2 illustrates a cross-section and a plan view of a high breakdown voltage capacitor according to one or more examples of the present disclosure. The shape of the dielectric layer pattern proposed by the present disclosure is specifically illustrated.

In FIG. 2, the semiconductor device includes a lower dielectric layer 310 and an upper dielectric layer 320 having a lower band gap characteristic than a silicon oxide layer at a lower portion of the upper electrode 160 when viewed together in a-a' cross-section. The lower/upper dielectric layers 310 and 320 are positioned between the third interlayer insulating layer 130 and the upper electrode 160.

Compared with FIG. 1, there is a difference only in that the dielectric layer pattern is composed of a plurality of layers of the lower dielectric layer 310 and the upper dielectric layer 320, but other configurations are the same. The lower dielectric layer 310 may be formed of PECVD silicon rich oxide (PE-SRO) or SiON (band gap: ~7.5), and the upper dielectric layer 320 may be formed of PE-SiN (band gap: 4.7-6). Here, a material having a band gap higher than that of PE-SiN (band gap: 4.7-6) is used as the band gap of the PE-SRO layer. Of course, it may be formed with one layer, or with three or more layers. Even in such a case, the thickness of the entire layer is formed to be thinner than that of the upper insulating layer 200 of FIG. 1.

The dielectric layer pattern 300 includes a lower dielectric layer 310 and an upper dielectric layer 320. The thickness of the upper dielectric layer 320 is different from that of the lower dielectric layer 310. When the dielectric layer pattern is formed of two or more layers, the upper dielectric layer 320 positioned immediately below the upper electrode 160 is formed to include regions having different thicknesses as a whole. The different thicknesses is because the region adjacent to the sidewall of the upper electrode 160 is formed to be inclined according to the etching process. On the other hand, all of the lower dielectric layers 310 have a uniform thickness because it is protected by the upper dielectric layer 320 in the etching process.

When the semiconductor device of FIG. 2 is viewed from a plan view, the semiconductor device has an upper electrode 160 in the center and an upper dielectric layer 320 completely surrounding the upper electrode 160. Thus, in a plan view, the region of the dielectric layer pattern 300 is formed to be larger than the region of the upper electrode 160.

Figure 3:
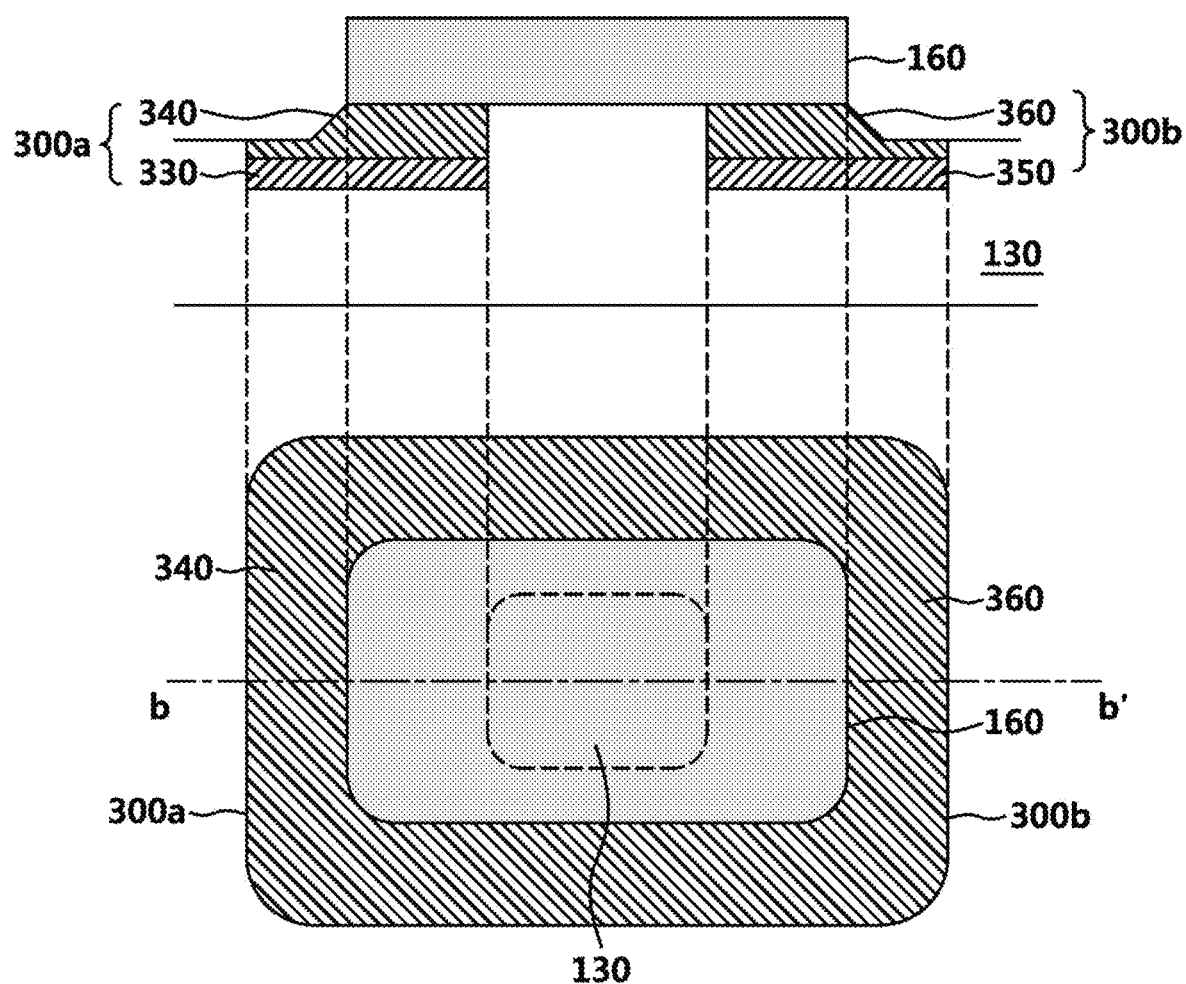
FIGS. 3 and 4 are views illustrating a cross-section and a plan view of a high breakdown voltage capacitor according to another example of the present disclosure.
Figure 4:
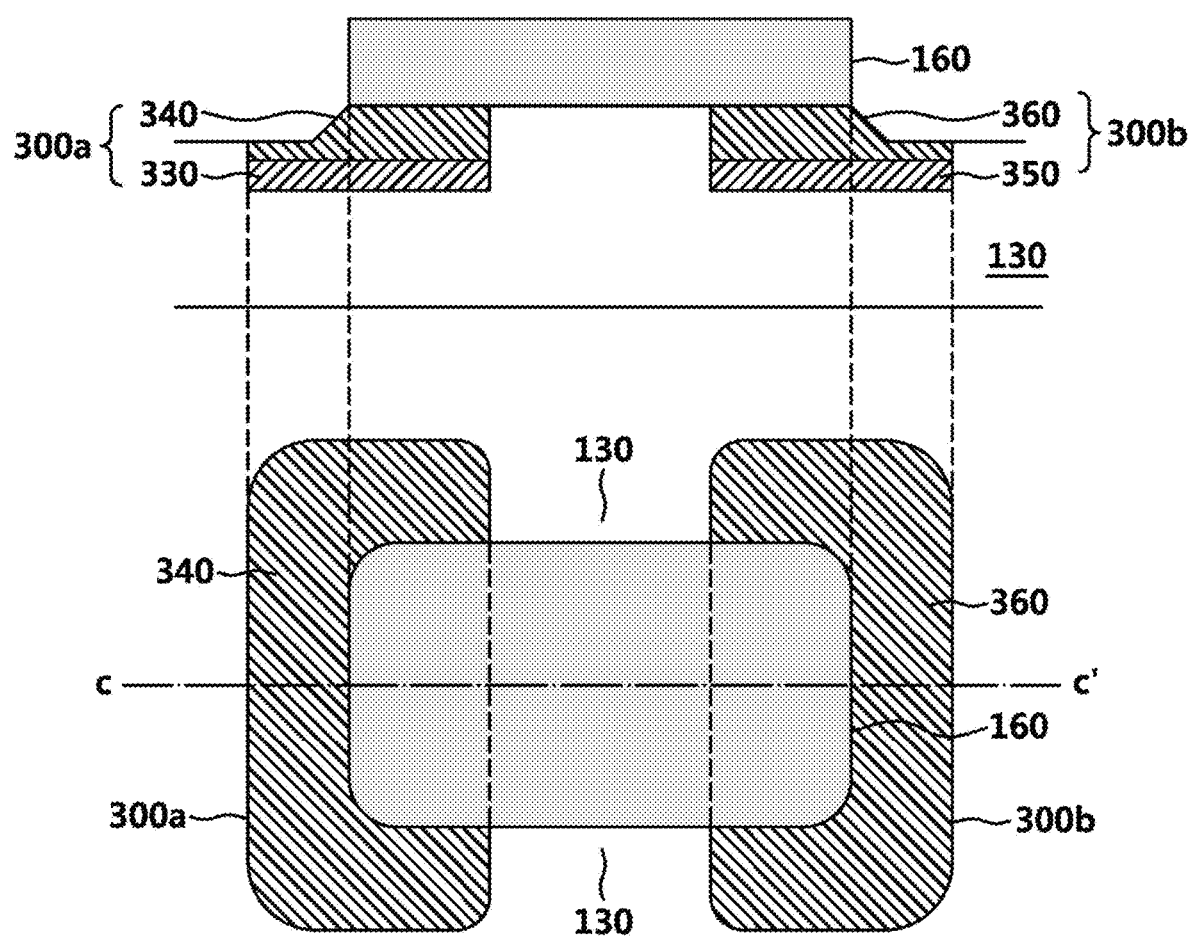

FIGS. 3 and 4 are views illustrating a cross-section and a plan view of a high breakdown voltage capacitor according to another example of the present disclosure.

As illustrated in FIG. 3, the dielectric layer pattern 300 includes a first dielectric layer pattern 300a and a second dielectric layer pattern 300b formed apart from each other. A third interlayer insulating layer 130 is formed between the first dielectric layer pattern 300a and the second dielectric layer pattern 300b.

In addition, the first and second dielectric layer patterns 300a and 300b include an upper dielectric layer and a lower dielectric layer, respectively. The first dielectric layer pattern 300a includes a first lower dielectric layer 330 and a first upper dielectric layer 340. The second dielectric layer pattern 300b includes a second lower dielectric layer 350 and a second upper dielectric layer 360. The first and second lower dielectric layers 330 and 350 and the first and second upper dielectric layers 340 and 360 are both formed to overlap the upper electrode 160.

Thus, a third interlayer insulating layer 130 is formed between the first lower dielectric layer 330 and the second lower dielectric layer 350. Likewise, a third interlayer insulating layer 130 is formed between the first upper dielectric layer 340 and the second upper dielectric layer 360. Therefore, the upper electrode 160 is formed while directly in contact with the first upper dielectric layer 340, the second upper dielectric layer 360, and the third interlayer insulating layer 130.

From the perspective view of the third interlayer insulating layer 130, the third interlayer insulating layer 130 is in contact with the side surfaces and bottom surfaces of the lower dielectric layers 330 and 350. In addition, the side surfaces of the upper dielectric layers 340 and 360 and the bottom surfaces of the upper electrode 160 are in contact with each other.

In the semiconductor device of FIG. 3 of a plan view, the first dielectric layer pattern 300a and the second dielectric layer pattern 300b are connected to each other. In addition, the first dielectric layer pattern 300a and the second dielectric layer pattern 300b surround the upper electrode 160. In a plan view, the area of the dielectric layer pattern 300 is formed to be larger than the area of the upper electrode 160.

The cross-section illustrated in FIG. 4 is very similar to the cross-section of FIG. 3.

The dielectric layer pattern 300 includes a first dielectric layer pattern 300a and a second dielectric layer pattern 300b formed apart from each other. A third interlayer insulating layer 130 is formed between the first dielectric layer pattern 300a and the second dielectric layer pattern 300b.

In addition, the first and second dielectric layer patterns 300a and 300b include an upper dielectric layer and a lower dielectric layer, respectively. The first dielectric layer pattern 300a includes a first lower dielectric layer 330 and a first upper dielectric layer 340. The second dielectric layer pattern 300b includes a second lower dielectric layer 350 and a second upper dielectric layer 360. The first and second lower dielectric layers 330 and 350 and the first and second upper dielectric layers 340 and 360 are both formed to overlap the upper electrode 160.

However, there is a difference between FIG. 3 and the plan view of FIG. 4. From a plan view, the first dielectric layer pattern 300a and the second dielectric layer pattern 300b are formed physically apart from each other. Therefore, the first dielectric layer pattern 300a and the second dielectric layer pattern 300b partially surround the upper electrode 160.

The first upper dielectric layer 340 and the second upper dielectric layer 360 are formed to be apart from each other. The first upper dielectric layer 340 and the second upper dielectric layer 360 are formed to be symmetrically spaced apart from each other with respect to the upper electrode 160. The dielectric layer pattern is removed from the center of the upper electrode 160. The third interlayer insulating layer 130 is in contact with side surfaces and bottom surfaces of the first and second lower dielectric layers 330 and 350. Likewise, the third interlayer insulating layer 130 is in contact with the side surfaces of the first and second upper dielectric layers 340 and 360 and the bottom surface of the upper electrode 160.

Even if a dielectric layer pattern is formed on the left/right side of the upper electrode 160 as illustrated in FIGS. 3 and 4 described above, an electric field may be effectively removed.

Figure 5:
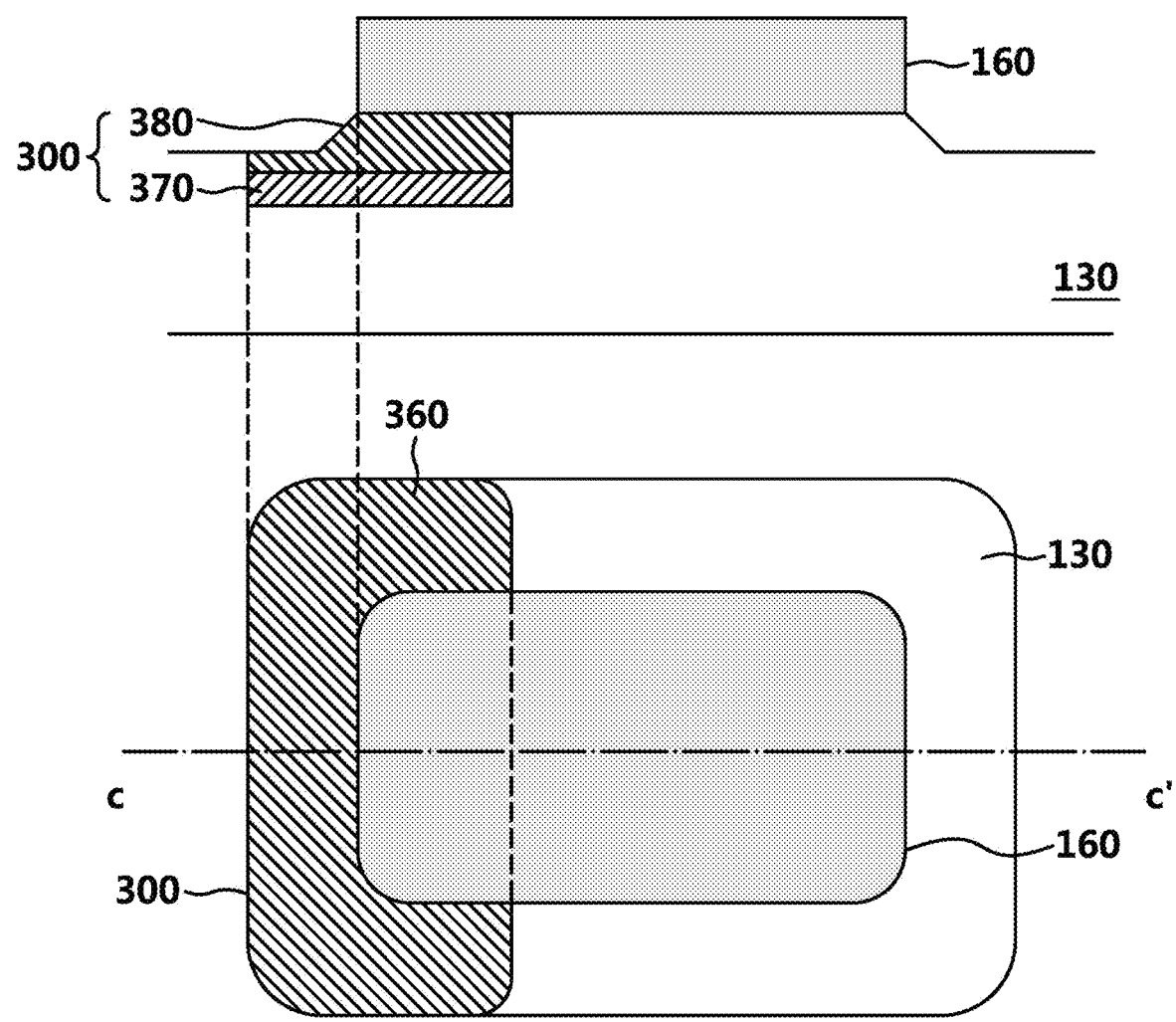
FIG. 5 illustrates a cross-section and a plan view of a high breakdown voltage capacitor according to another example of the present disclosure.

FIG. 5 illustrates a cross-section and a plan view of a high breakdown voltage capacitor according to another example of the present disclosure.

As illustrated in FIG. 5, the semiconductor device of the present disclosure may include a dielectric layer pattern 300, including a lower dielectric layer 370 and an upper dielectric layer 380 formed only in one direction of the upper electrode 160. Referring to the drawings, the lower/upper dielectric layers 370 and 380 are formed under the upper electrode 160 in a direction adjacent to the metal wiring region 10. In addition, the lower/upper dielectric layers 370 and 380 are formed to overlap with the part of the left side of the upper electrode 160, and all of the remaining regions are formed of the interlayer insulating layer 130. As illustrated in FIG. 5, even if a dielectric layer pattern is formed only in a region adjacent to the metal wiring region 10 among the lower regions of the upper electrode 160, sufficient breakdown voltage characteristics may be provided. That is, the local electric field concentrated in the corner of the upper electrode 160 may be alleviated.

As described in the semiconductor device of the present disclosure, a dielectric layer pattern 300 having one or more layers is formed under the upper electrode 160, and the dielectric layer pattern may be formed while having various patterns in a specific region of the upper electrode 160.

FIGS. 6A-6L are process diagrams illustrating a manufacturing process of a semiconductor device, including a high breakdown voltage capacitor, according to one or more examples of the present disclosure. The semiconductor devices described above are manufactured by the following method.

According to the present disclosure, a device (not illustrated) is formed on the semiconductor substrate 100. The device may be applied as a passive device or an active device. In addition, an insulating layer may be deposited to insulate the device. According to an example of the present disclosure, a device and an insulating layer on it are deposited on the semiconductor substrate 100 as described above. In addition, the semiconductor device of the present disclosure is divided into a metal wiring region 10 and a capacitor region 20. Further, in the semiconductor device, the first to third interlayer insulating layers 110, 120, and 130 are formed, as an example, but the number of such interlayer insulating layers may vary.

As illustrated in FIG. 6A, a lower insulating layer 105 is formed on the semiconductor substrate 100, and a plurality of first metal wirings 112 and 114 are formed together on the lower insulating layer 105. When the first metal wirings 112 and 114 are formed, a first interlayer insulating layer 110 is deposited to cover the first metal wirings 112 and 114. The first interlayer insulating layer 110 may include an oxide layer deposited by a PECVD method using a TEOS material. A layer such as SiN, SiC, SiOCN, or SiCN may be further included below or above the oxide layer. Also, instead of an oxide layer, it may be formed of a low-k SiOC material. In addition, the first interlayer insulating layer 110 is planarized through a chemical mechanical polishing (CMP) process or an etch back process to have a predetermined thickness, for example, a thickness of 0.4 to 1.5 μm (D1). After the first interlayer insulating layer 110 is formed, a plurality of first vias 140a is formed in the first interlayer insulating layer 110. The plurality of first vias 140a may be formed through a series of mask processes and etching processes. The first via 140a is filled with a metallic material. The plurality of first vias 140a is formed simultaneously for the metal wiring region 10 and the capacitor region 20.

Then, after depositing a metal material as illustrated in FIG. 6A, a second metal wiring 122 is formed in the metal wiring region 10, and a lower electrode 124 is formed in the capacitor region 20, respectively, through a metal patterning process. In this drawing, the first metal wiring 112 and the second metal wiring 122 in the metal wiring region 10 are almost aligned in the vertical direction, but they may be formed while not being aligned with each other. In addition, the capacitor region 20 may also be in a form in which the lower electrode 124 is connected to the second metal wiring 122.

Figure 6B:
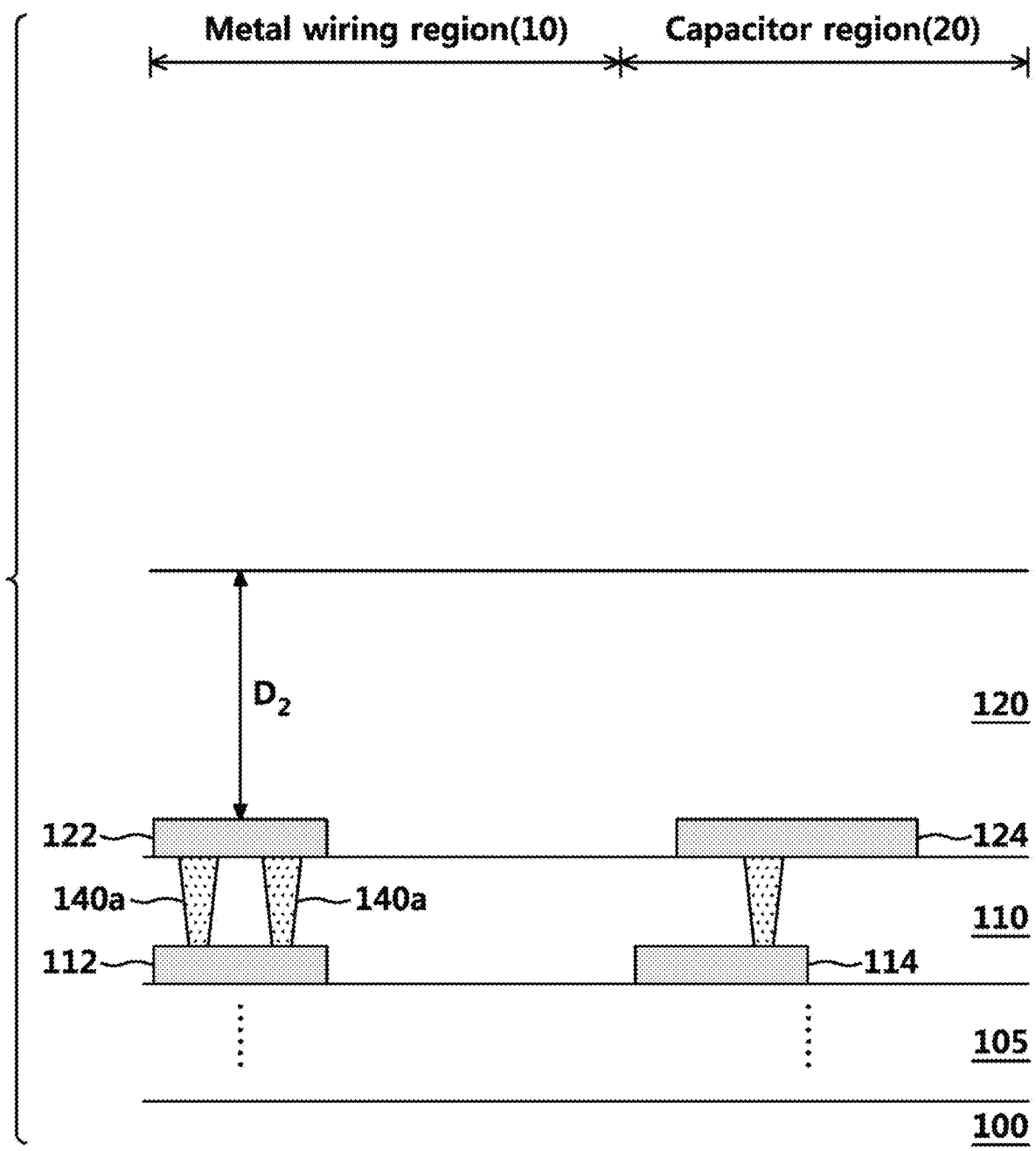

FIG. 6B illustrates that the second interlayer insulating layer 120 is formed on the first interlayer insulating layer 110 to a predetermined thickness D2. The second interlayer insulating layer 120 is thicker than the first interlayer insulating layer 110. The thickness is about 3 to 8 μm. The second interlayer insulating layer 120 may also include an oxide layer deposited by a PECVD method using a TEOS material. A layer such as SiN, SiC, SiOCN, or SiCN may be further included below or above the oxide layer. Also, instead of an oxide layer, it may be formed of a low-k SiOC material. A CMP process or an etch back process etc., is performed to planarize so that it may become the said thickness.

Figure 6C:
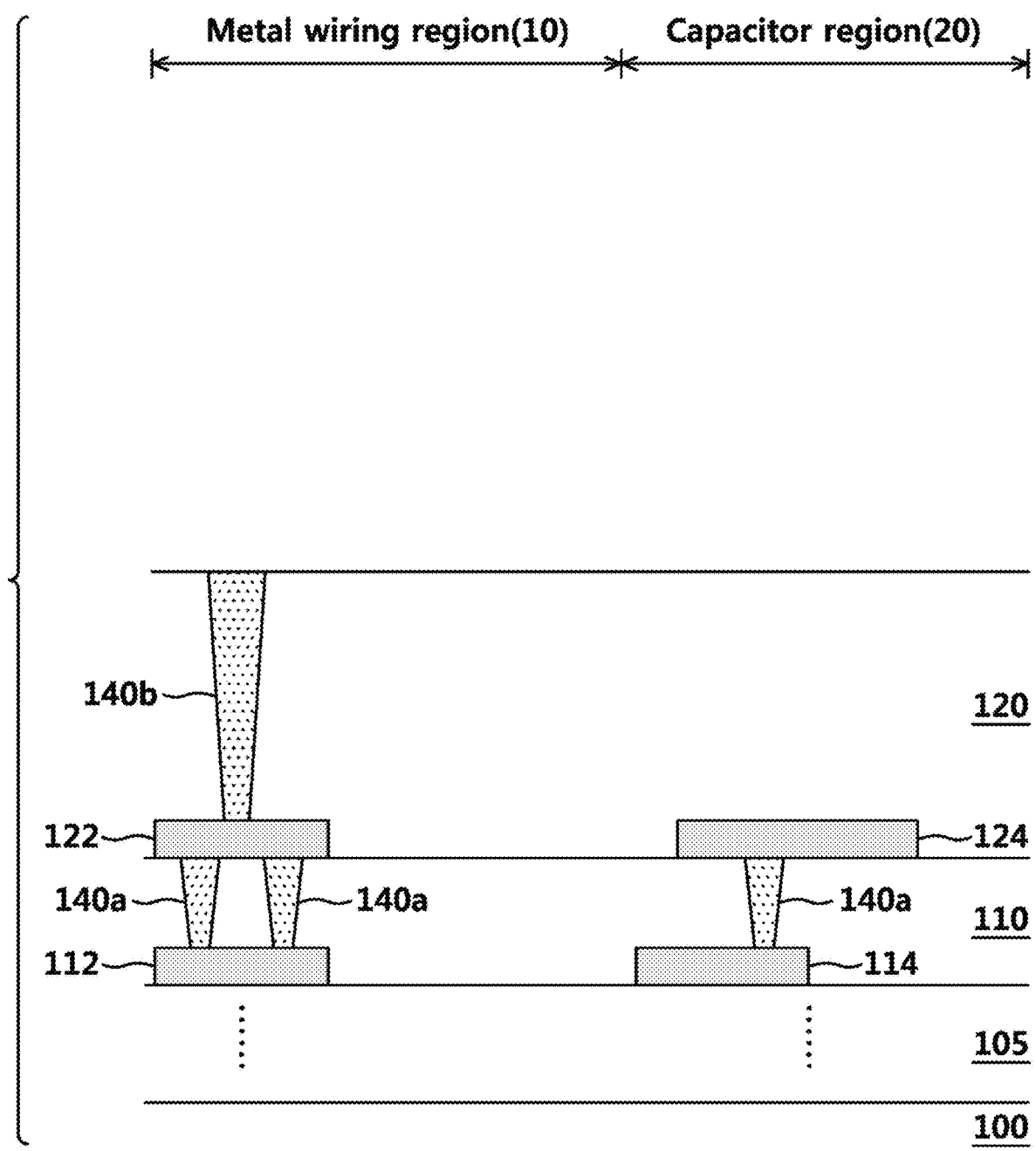

Referring to FIG. 6C, a second via 140b is formed in the second interlayer insulating layer 120. As described above, the second via 140b may be formed through a mask process and an etching process, and a metal wiring is formed in the second via 140b. At this time, it is not necessary to form the via in the capacitor region 20. This is because there is no metal wiring in the capacitor region 20 between the upper electrode 160 and the lower electrode 124.

Figure 6D:
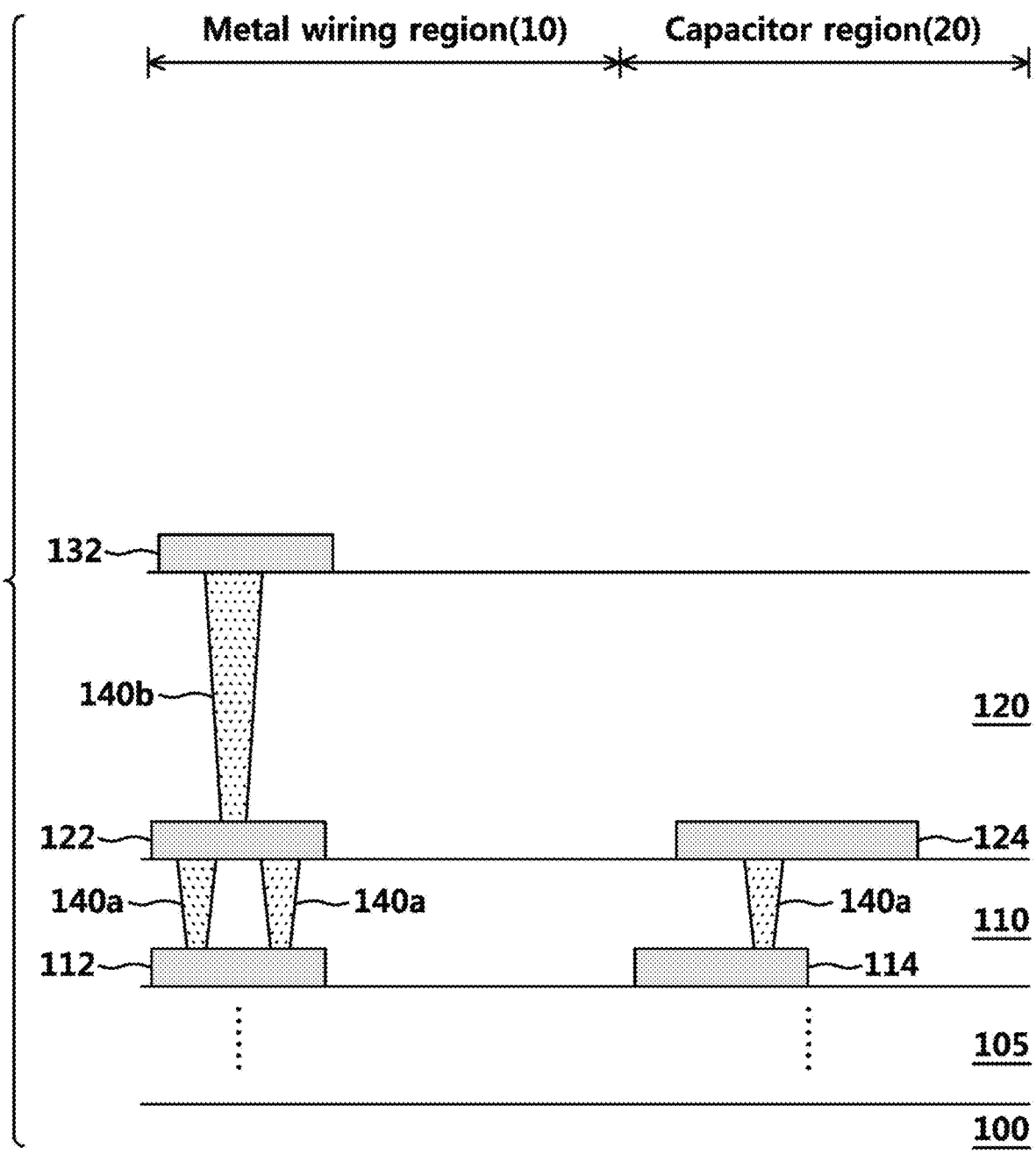

As illustrated in FIG. 6D, the third metal wiring 132 is formed in the metal wiring region 10. Metal wiring is not formed in the capacitor region 20 because an electrical connection with a semiconductor device is not required. In FIG. 6D, the third metal wiring 132 is electrically connected to the lower second metal wiring 122 and the first metal wiring 112 through vias 140b and 140a.

As illustrated in FIG. 6E, a third interlayer insulating layer 130 is formed to cover the third metal wiring 132. The thickness D3 of the third interlayer insulating layer 130 is formed to be the same as or similar to the thickness (3 to 8 μm) of the second interlayer insulating layer 120. The third interlayer insulating layer 110 may include an oxide layer deposited by a PECVD method using a TEOS material. A layer such as SiN, SiC, SiOCN, or SiCN may be further included below or above the oxide layer. In addition, instead of the oxide layer, it may be formed of a SiOC material having a low dielectric constant (low-k). Like the second interlayer insulating layer 120, a planarization process may be performed.

With regards to the interlayer insulating layers 110, 120, and 130 in the semiconductor device of the present disclosure, the second interlayer insulating layer 120 and the third interlayer insulating layer 130 are thicker than the first interlayer insulating layer 110. However, the thicknesses of the second interlayer insulating layer 120 and the third interlayer insulating layer 130 are the same or similar.

Figure 6F:
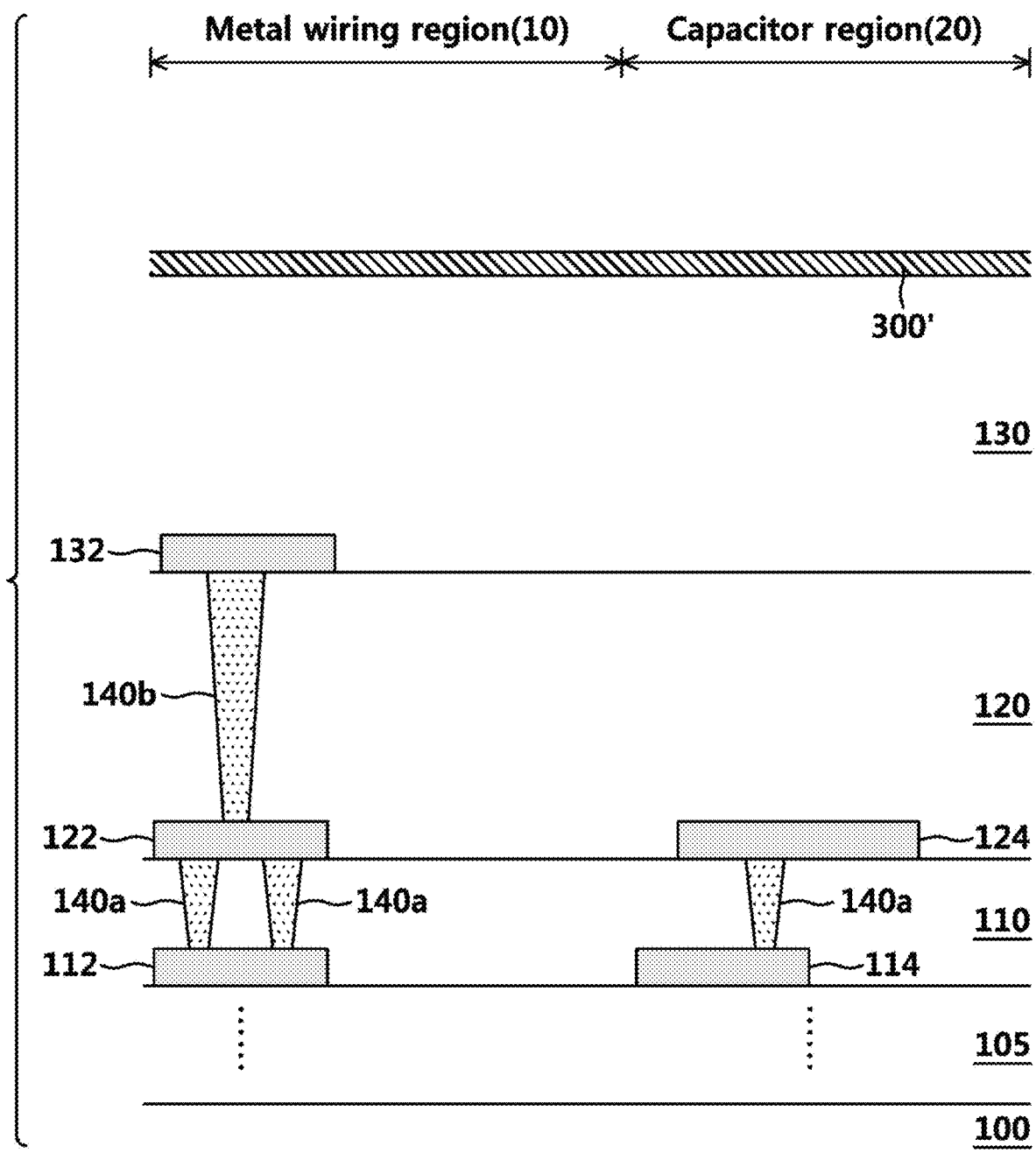

FIG. 6F is a diagram illustrating an example of forming a dielectric layer proposed by the present disclosure. As illustrated in FIG. 6F, a dielectric layer 300' is deposited to a thickness of 0.10 to 2.5 μm with respect to the entire region of the third interlayer insulating layer 130. The dielectric layer 300' later becomes a dielectric layer pattern 300 formed only in a specific lower region of the upper electrode. The dielectric layer 300' improves the isolator characteristics of the capacitor region 20, and a dielectric material having a band gap lower than the oxide layer ($SiO_2$) constituting the interlayer insulating layers 110, 120, and 130 is used. The dielectric material may be PECVD SRO, PECVD SiON, PECVD SiN, or the like, and may be deposited in a form of single layer or bi-layer.

As described above, in the present example, the dielectric layer 300' having a low band gap is formed before the upper electrode 160 is formed. Although described below, the dielectric layer 300' may be formed only in a portion necessary for the capacitor region 20 while not being formed in the metal wiring region 10 through a patterning process later.

Figure 6G:
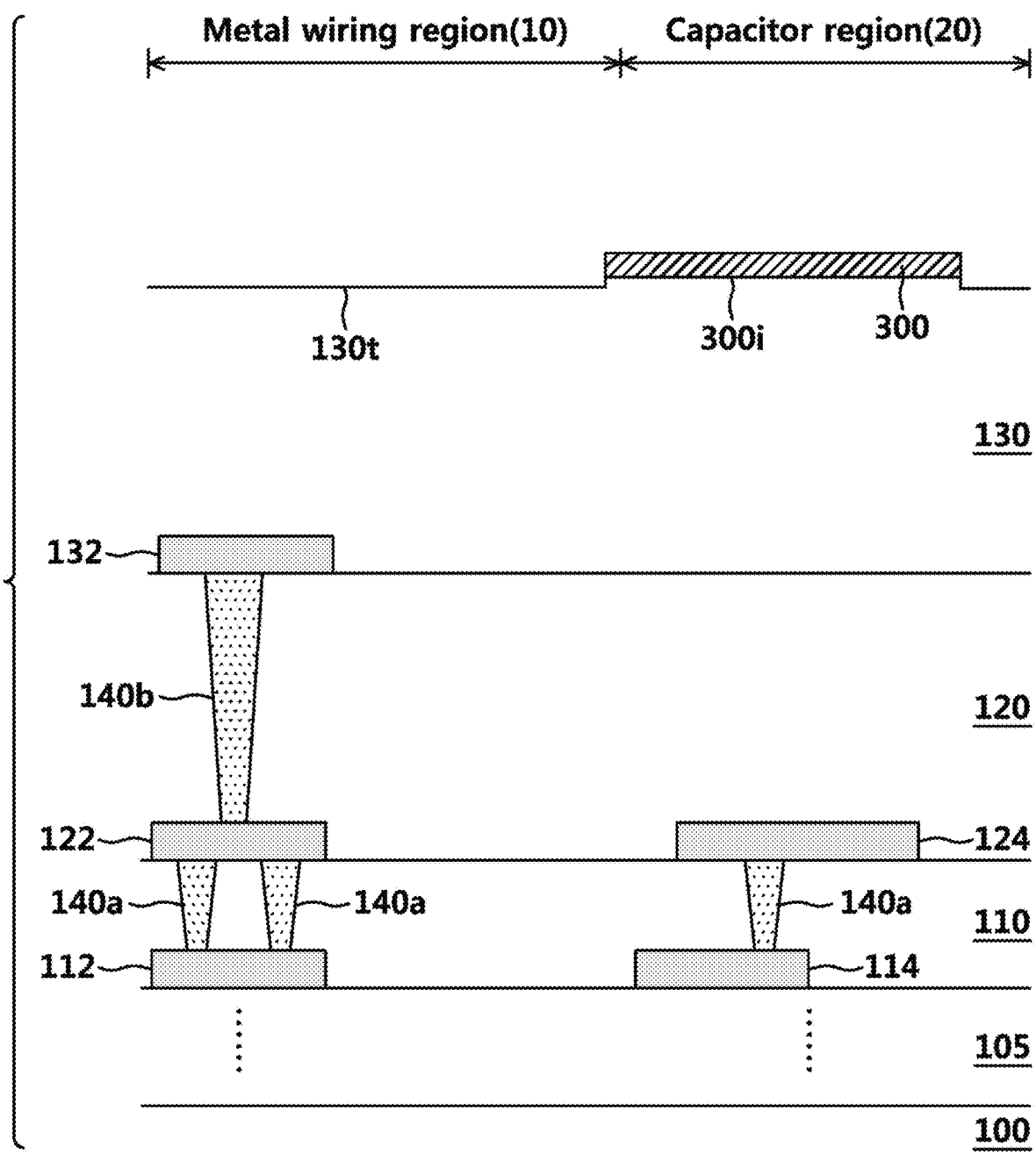

FIG. 6G is a diagram illustrating an example in which a dielectric layer pattern is formed by performing a patterning process on a capacitor region. After depositing the entire dielectric layer 300' having a predetermined thickness of FIG. 6F, the dielectric layer pattern 300 is formed only in a desired region, including the capacitor region 20 with high breakdown voltage, by using a patterning mask (not illustrated). In FIG. 6G, '300' denotes a dielectric layer pattern formed by the patterning process. The length and shape of the dielectric layer pattern 300 are determined according to the patterning mask. That is, if the shape of the patterning mask is different in FIG. 6G, the shape of the dielectric layer pattern 300 may be different as in FIGS. 3 to 5 described above. Therefore, according to the examples of the present disclosure, the semiconductor device may provide a dielectric layer pattern having various shapes. In addition, there are only some differences in the patterning process performed in FIG. 6G in the entire process of the semiconductor device, and all processes before and after are the same. That is, if only the patterning mask is applied differently during the process, it is possible to simply form a dielectric layer pattern suitable for the characteristics of the semiconductor device.

FIG. 6G illustrates that the top surface 130*t* of the third interlayer insulating layer 130 of the metal wiring region 10 is etched to be deeper than the bottom surface 300*i* of the dielectric layer pattern 300. A pattern mask is provided in the capacitor region 20, and it is etched to be deeper because the dielectric layer pattern in the metal wiring region 10 is to be completely removed. Therefore, when the patterning process is completed, a predetermined gap occurs between the metal wiring region 10 and the capacitor region 20, as illustrated in FIG. 1 'G'.

Figure 6H:
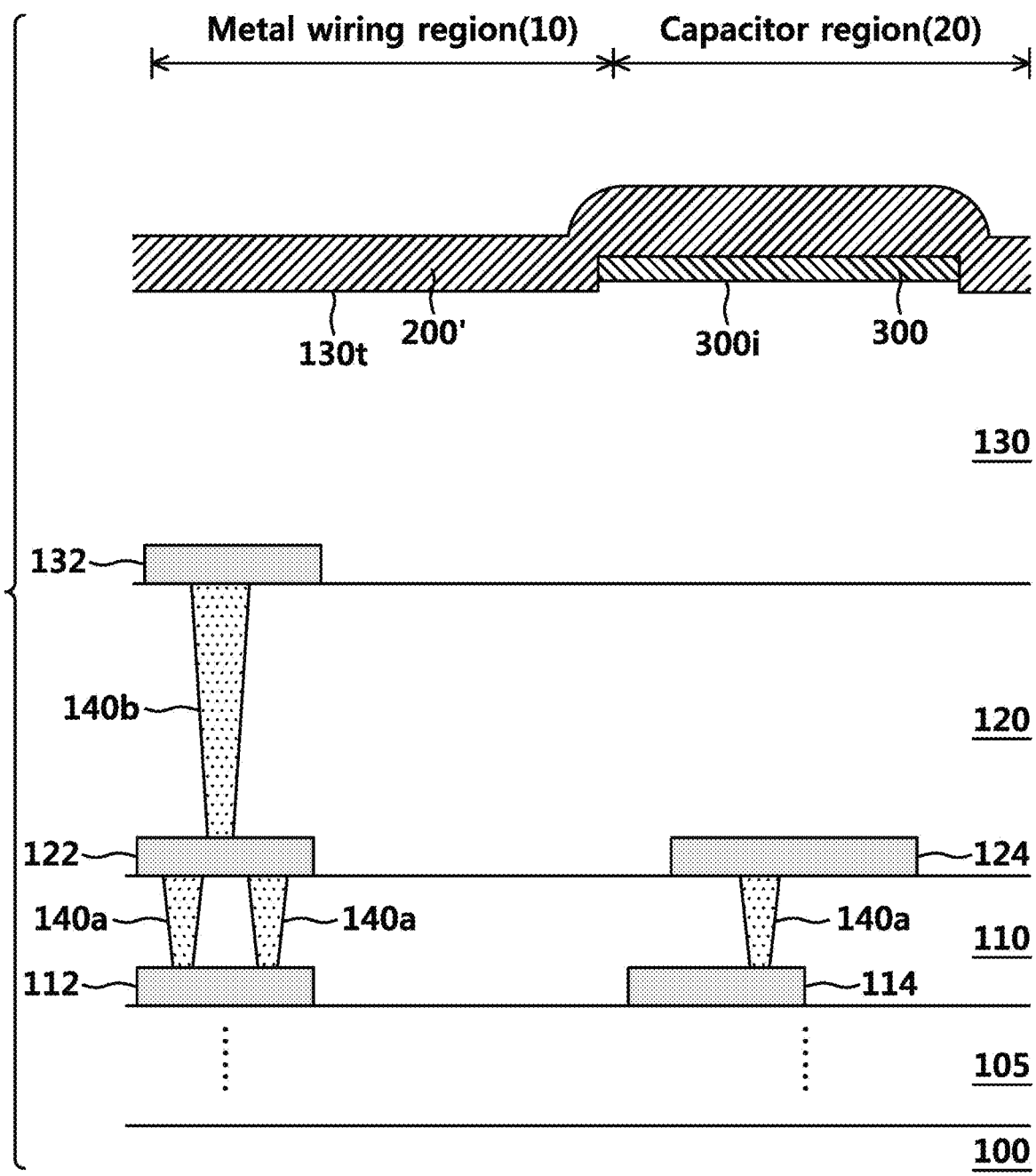

FIG. 6H illustrates that a thick insulating layer 200' is deposited over the entire region of the metal wiring region 10 and the capacitor region 20, in a state that the dielectric layer pattern 300 is formed in the capacitor region 20. Because the dielectric layer pattern 300 is already formed in the capacitor region 20, the thick insulating layer 200' is formed to be convex upward in the capacitor region 20. The thick insulating layer 200' is deposited to have a thickness of 0.5 to 3.0 μm. The thick insulating layer 200' may be formed of a silicon oxide layer material. The thick insulating layer 200' may be formed of a material different from the dielectric layer pattern 300. While the thick insulating layer 200' is formed of a silicon oxide layer material, the dielectric layer pattern 300 is formed of a material such as SRO, SiON, or SiN having a band gap smaller than the silicon oxide layer. The thick insulating layer 200' may be formed of an oxide layer-based material such as the interlayer insulating layer 130 to simplify the process. Therefore, the boundary of the finally formed upper insulating layer 200 and the interlayer insulating layer 130 may not be visible.

Figure 6I:
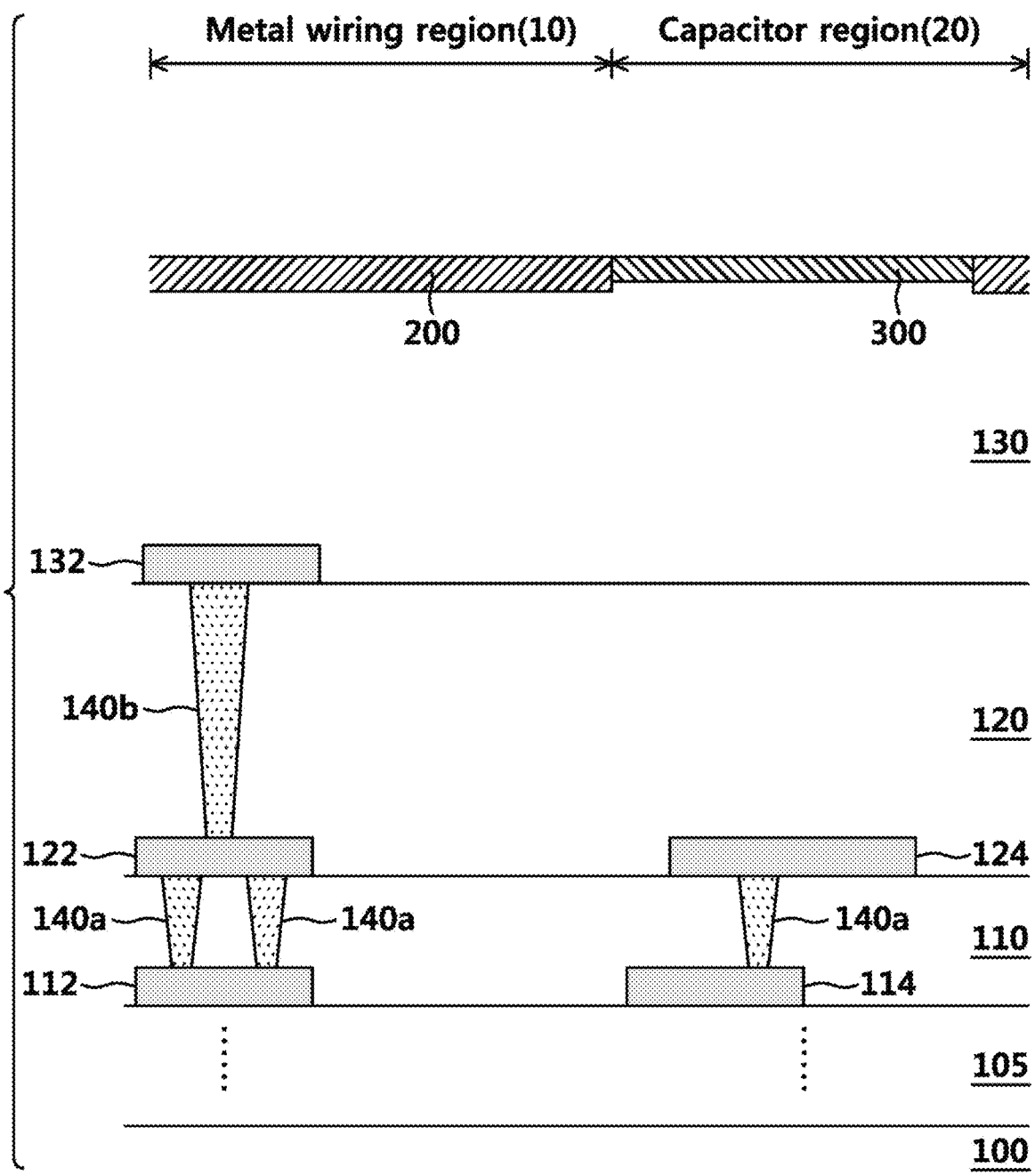

FIG. 6I illustrates that an etch-back or chemical mechanical polishing (CMP) process is performed to remove the thick insulating layer 200' on the capacitor region 20. During the etch back process or the chemical mechanical polishing process, the dielectric layer pattern 300 of the capacitor region 20 functions as an etch stop layer. Because the dielectric layer pattern 300 is formed of a material different from the thick insulating layer 200', it may be used as an etch stop layer. Thus, an upper insulating layer 200 having a thin thickness is formed on the interlayer insulating layer 130. The upper surface of the thin upper insulating layer 200 formed by the chemical mechanical polishing process and the upper surface of the dielectric layer pattern 300 are planar to each other. When the chemical mechanical polishing process is completed, the thin upper insulating layer 200 remains in the metal wiring region 10, as illustrated in FIG. 6I, and the dielectric layer pattern 300 remains in the capacitor region 20.

Figure 6J:
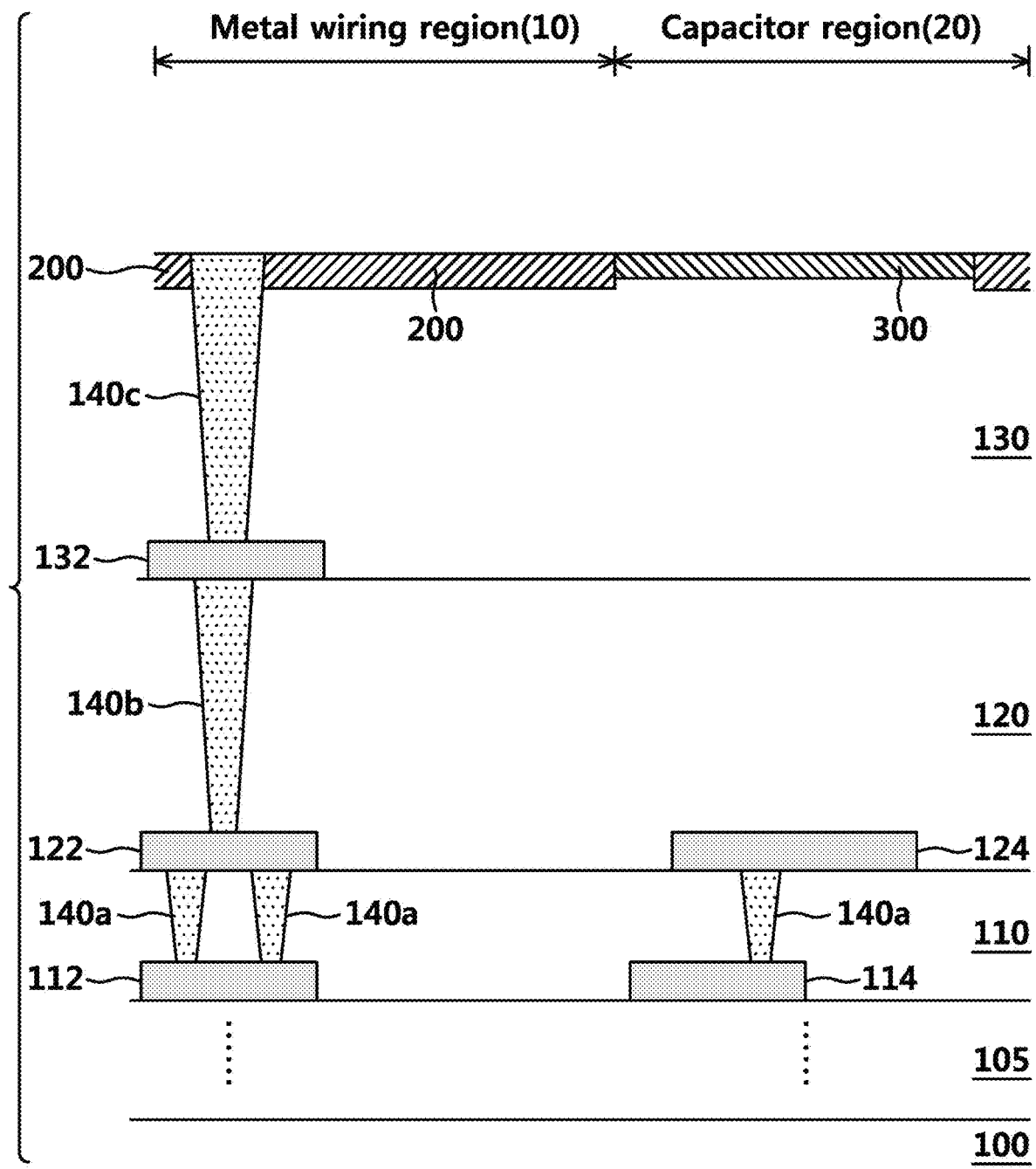

FIG. 6J is a process of forming a third via 140*c* in the third interlayer insulating layer 130 and the upper insulating layer 200. It may be formed through a mask process and an etching process. Since forming of the third via 140*c* of FIG. 6J only corresponds to the metal wiring region 10, and there is no dielectric layer pattern 300; therefore, an additional process for removing the dielectric layer pattern 300 is not required. The third via 140*c* is formed by etching the upper insulating layer 200 and the third interlayer insulating layer 130 to form a hole, filling a metal material, and performing an etch back or CMP process.

Figure 6K:
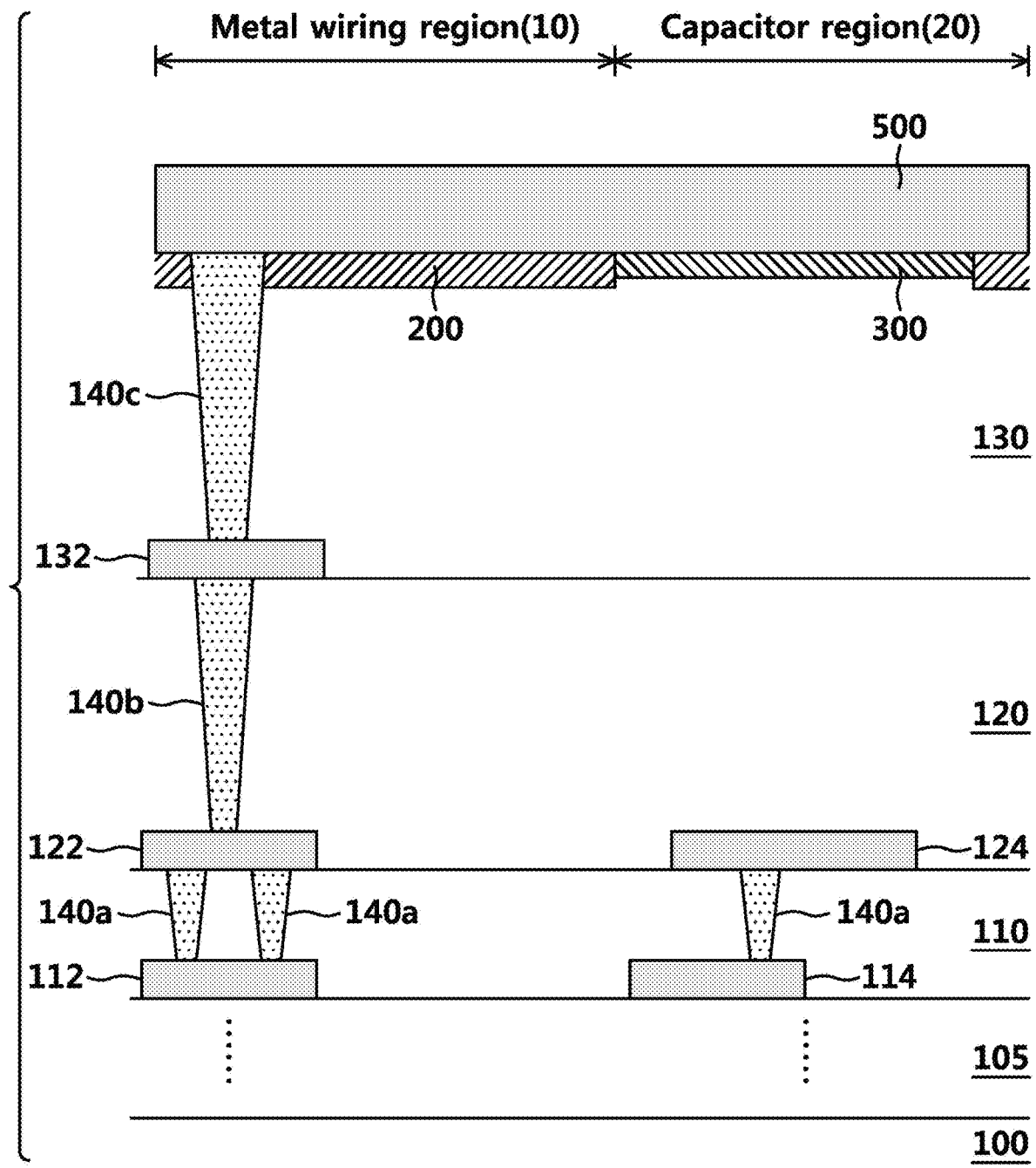

Referring to FIG. 6K, a metal layer 500 is deposited on the upper insulating layer 200 and the dielectric layer pattern 300 to have a predetermined thickness. The metal layer 500 later becomes a pattern for forming the upper metal wiring 150 of the metal wiring region 10 and the upper electrode 160 of the capacitor region 20.

Figure 6L:
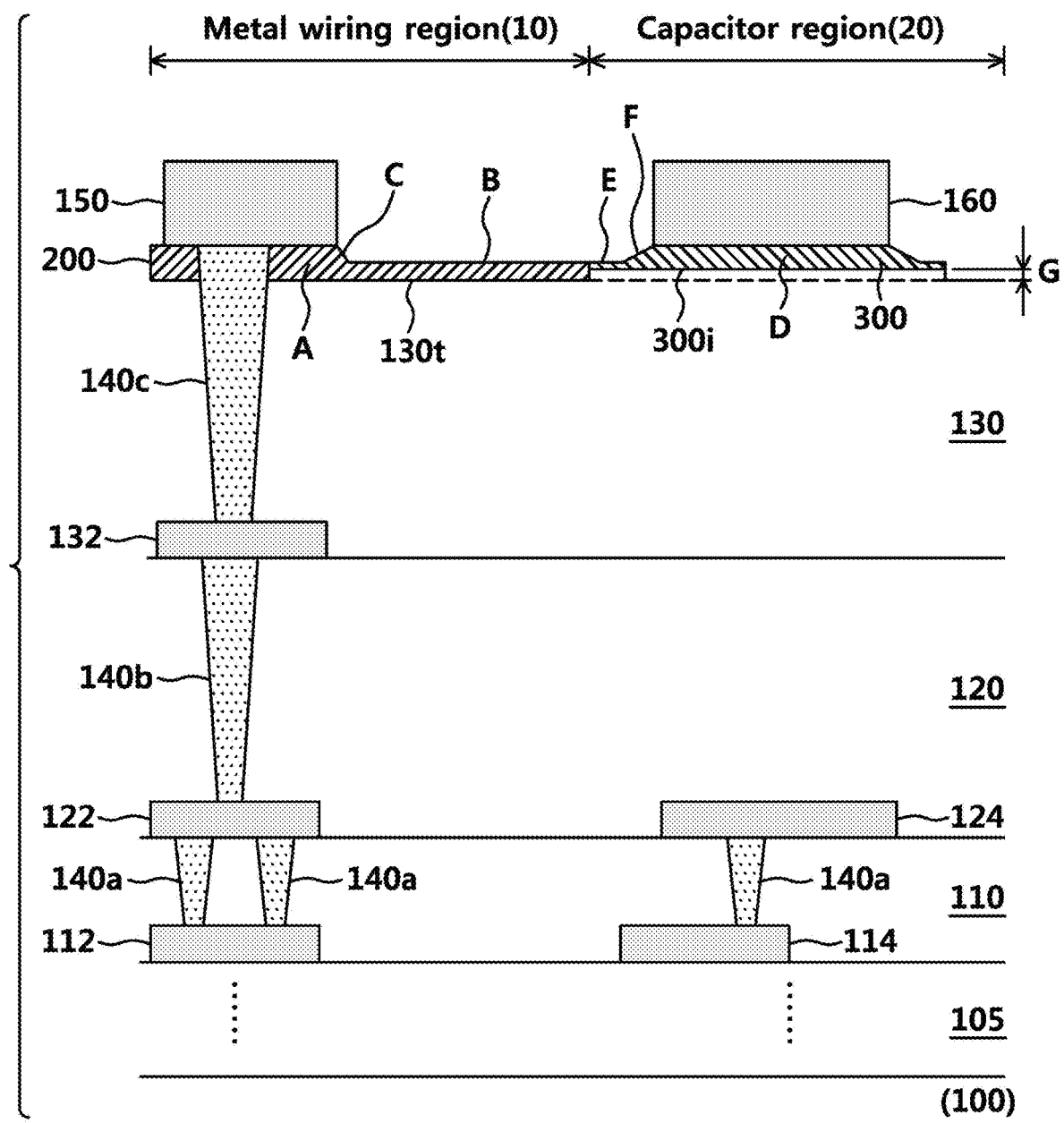

Next, it is a process of etching the metal layer 500. This process may be referred to as a process for forming the upper metal wiring 150 in the metal wiring region 10 and forming the upper electrode 160 in the capacitor region 20. The etching process of the metal layer 500 is performed after forming a patterning mask for forming the upper metal wiring 150 and the upper electrode 160. FIG. 6L illustrates a state in which the etching process of the metal layer 500 is completed.

Referring to FIG. 6L, an upper insulating layer 200 and a dielectric layer pattern 300 having different thicknesses are formed. As described above, the upper insulating layer 200 may be divided into regions A, B, and C. Also, the dielectric layer pattern 300 may be divided into regions D, E, and F. The regions B, C, E, and F are formed because the upper insulating layer 200 and the dielectric layer 200' are partially etched by a dry etching process for forming the upper metal wiring 150 and the upper electrode 160. Therefore, the upper insulating layer 200 of the region A and the dielectric layer pattern 300 of the region D under the upper metal wiring 150 and the upper electrode 160 are protected from the dry etching process to maintain their thickness. However, the thickness of the upper insulating layer and the dielectric layer in the remaining regions (B, C, E, F) are reduced.

According to this process, the present disclosure may form the dielectric layer pattern 300 having a low band gap energy only in the high breakdown voltage capacitor region 20. In addition, the dielectric layer pattern 300 may be formed of one or more layers, and the length and shape of the dielectric layer pattern may be variously designed according to the etching process. In such a way, because the dielectric layer pattern 300 having a band gap characteristic lower than the silicon oxide layer may be formed only in a specific region under the upper electrode 160, it is possible to freely make layout of the semiconductor device and minimize unnecessary processes.

According to the present disclosure as described above, the manufacturing process of the peripheral device is facilitated because the dielectric layer pattern for high breakdown voltage characteristics is formed only in the high breakdown voltage capacitor region and is removed from the peripheral device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device having a substrate, the semiconductor device comprising:
a capacitor region, comprising:
a lower electrode formed on the substrate;
an interlayer insulating layer formed on the lower electrode;
a dielectric layer pattern formed on the interlayer insulating layer; and
an upper electrode formed on the dielectric layer pattern; and
a metal wiring region, comprising:
a lower metal wiring formed parallel to the lower electrode;
the interlayer insulating layer formed on the lower metal wiring;
an upper insulating layer formed on the interlayer insulating layer and having a thickness smaller than a thickness of the interlayer insulating layer; and
an upper metal wiring formed on the upper insulating layer, and formed in parallel with the upper electrode,
wherein the upper insulating layer and the dielectric layer pattern are formed of different materials, and
wherein each of the upper insulating layer and the dielectric layer pattern has a contour comprising an inclined portion.

2. The semiconductor device of claim 1, wherein the upper insulating layer and the dielectric layer pattern are in contact with each other, and a thickness of the dielectric layer pattern is formed to be thinner than the thickness of the upper insulating layer.

3. The semiconductor device of claim 1, wherein the dielectric layer pattern includes an upper dielectric layer and a lower dielectric layer, and a thickness of the upper dielectric layer is formed to be different from a thickness of the lower dielectric layer.

4. The semiconductor device of claim 1, wherein the dielectric layer pattern is formed of a dielectric material having a band gap lower than a band gap of the upper insulating layer.

5. The semiconductor device of claim 1, wherein the dielectric layer pattern comprises any one of silicon rich oxide, SiON, or SiN.

6. The semiconductor device of claim 1, wherein an area of the dielectric layer pattern in a top view is formed to be larger than an area of the upper electrode.

7. The semiconductor device of claim 1, wherein the dielectric layer pattern is formed of first and second dielectric layer patterns that are formed apart from each other.

8. The semiconductor device of claim 1, wherein the interlayer insulating layer is in direct contact with the upper electrode.

9. The semiconductor device of claim 1, wherein a bottom surface of the upper insulating layer is formed to be lower than a bottom surface of the dielectric layer pattern.

10. The semiconductor device of claim 1, wherein the dielectric layer pattern is separated from the lower electrode by the interlayer insulating layer, and
wherein the upper electrode is separated from the lower electrode by at least the dielectric layer pattern and the interlayer insulating layer.

11. The semiconductor device of claim 1, wherein the interlayer insulating layer is disposed on an entire upper surface of the lower electrode.

12. A semiconductor device, comprising:
a lower electrode on a semiconductor substrate;
an interlayer insulating layer formed on the lower electrode;
a dielectric layer pattern formed on the interlayer insulating layer;
an upper insulating layer formed, on the interlayer insulating layer, of a material different from a material of the dielectric layer pattern; and
an upper metal wiring and an upper electrode formed on the upper insulating layer and the dielectric layer pattern, respectively, and
wherein each of the upper insulating layer and the dielectric layer pattern has a contour comprising an inclined portion.

13. The semiconductor device of claim 12, wherein the dielectric layer pattern includes a lower dielectric layer and an upper dielectric layer, and a thickness of the lower dielectric layer is uniform.

14. The semiconductor device of claim 12, wherein a bottom surface of the upper insulating layer is formed to be deeper than a bottom surface of the dielectric layer pattern.

15. The semiconductor device of claim 12, wherein the dielectric layer pattern includes:
a region overlapping the upper electrode;
a region that does not overlap the upper electrode; and
a region in which the pattern thickness of the dielectric layer is changed,
wherein a thickness of the region overlapping the upper electrode is greater than a thickness of the region not overlapping the upper electrode.

16. The semiconductor device of claim 12, wherein the dielectric layer pattern includes an upper dielectric layer and a lower dielectric layer, and
wherein a thickness of the upper dielectric layer is formed to be greater than a thickness of the lower dielectric layer.

17. The semiconductor device of claim 12, wherein the dielectric layer pattern is formed of a dielectric material having a band gap lower than a band gap of the upper insulating layer,
wherein the upper insulating layer includes a silicon oxide layer, and
wherein the dielectric layer pattern includes any one of silicon rich oxide, SiON, or SiN.

18. The semiconductor device of claim 12, wherein a thickness of the dielectric layer pattern and a thickness of the upper insulating layer are different from each other.

19. The semiconductor device of claim 12, wherein the interlayer insulating layer is disposed on an entire upper surface of the lower electrode.

20. The semiconductor device of claim 12, further comprising:
a first lower metal wiring on the semiconductor substrate, wherein the interlayer insulating layer is further formed on the first lower metal wiring;
a second lower metal wiring formed at an intermediate position between the first lower metal wiring and the upper insulating layer;
a first via formed on the first lower metal wiring; and
a second via formed on the second lower metal wiring.

21. A semiconductor device having a substrate, the semiconductor device comprising:
a first region, comprising:
a lower electrode formed on the substrate;
an interlayer insulating layer formed on the lower electrode;
a dielectric layer pattern formed on the interlayer insulating layer; and an upper electrode formed on the dielectric layer pattern; and a second region, comprising:

an upper insulating layer formed on the interlayer insulating layer and having a thickness smaller than a thickness of the interlayer insulating layer; and an upper metal wiring formed on the upper insulating layer, and formed in a same plane with the upper electrode, wherein a lower surface of the upper insulating layer and a lower surface of the dielectric layer pattern are in different planes, and wherein each of the upper insulating layer and the dielectric layer pattern has a contour comprising an inclined portion.

22. The semiconductor device of claim 21, wherein the second region further comprises:

a first lower metal wiring and the lower electrode formed on a same plane, wherein the interlayer insulating layer is further formed on the first lower metal wiring;

a second lower metal wiring formed at an intermediate position between the first lower metal wiring and the upper insulating layer;

a first via formed on the first lower metal wiring; and a second via formed on the second lower metal wiring.

23. The semiconductor device of claim 21, wherein the first region is a capacitor region and the second region is a metal wiring region.

24. The semiconductor device of claim 21, wherein the upper insulating layer and the dielectric layer pattern are formed of different materials.

* * * * *